United States Patent [19]
Sullivan et al.

[11] Patent Number: 6,104,374
[45] Date of Patent: Aug. 15, 2000

[54] SPARSE VECTOR RASTERIZATION

[75] Inventors: Steven K. Sullivan; Kenneth P. Dobyns; David P. Maguire; Paul M. Gerlach; Samuel J. Peters; Robert C. Proebstel; Jing-Fan Zhang, all of Beaverton, Oreg.

[73] Assignee: Tektronix, Inc., Beaverton, Oreg.

[21] Appl. No.: 09/026,185

[22] Filed: Feb. 19, 1998

[51] Int. Cl.[7] .............................. G09G 5/36; G09G 5/10
[52] U.S. Cl. ........................................ 345/134; 345/147
[58] Field of Search ................................. 345/133, 134, 345/135, 138, 147, 148, 149, 63, 94, 440

[56] References Cited

U.S. PATENT DOCUMENTS

| | | |
|---|---|---|
| 5,387,896 | 2/1995 | Alappat . |
| 5,400,044 | 3/1995 | Thomas .................................. 345/147 |
| 5,790,764 | 8/1998 | Suzuki ..................... 358/1.9 |
| 5,995,117 | 8/1998 | Dobyns et al. ......................... 345/441 |

FOREIGN PATENT DOCUMENTS

| | | |
|---|---|---|
| 0 347 901 | 6/1989 | European Pat. Off. . |
| 0 789 244 | 2/1997 | European Pat. Off. . |
| WO 97/44677 | 11/1997 | WIPO . |

*Primary Examiner*—Mark R. Powell
*Assistant Examiner*—Thu Nguyen
*Attorney, Agent, or Firm*—Boulden G. Griffith; Thomas F. Lenihan

[57] ABSTRACT

A method for rasterization of a set of voltage-versus-time data-address pairs into horizontal and vertical locations of a multi-bit raster display memory of a digital oscilloscope or similar electronic data acquisition instrument is disclosed. It provides a new way of controlling digital intensity, by allowing the operator and/or a function based on the instrument's trigger rate to set the number of intensity units available for brightening the pixels affected by the rasterization of each acquisition data pair. If a vector has more pixels than there are units of intensity available, the number of pixels that are to be brightened is limited but spread out over the vector's length by an algorithm that includes at least some degree of randomization. If there are more units of intensity available than there are pixels to put them in, the extra ones can either be distributed into each pixel or randomly added along the vector or ignored. If the vector has no length, all of the available intensity, or some lesser amount of intensity, is put on one pixel. Setting a small minimum vector length, below which only limited vector fill is used, can save time by limiting the amount spent on insignificant details. Setting maximum and minimum intensity levels for those pixels that are affected by the rasterization process can limit saturation and assure that areas that receive only one or a few attacks will still have an intensity level that is perceptible. Sparse vector rasterization avoids the hard binary choice between using a dot mode or a vector mode, and gives the user an analog-like intensity control that produces a perceived continuum of viewing choices. It does this while maximizing the number of pixels updated within the context of how many waveforms are being acquired and need to be processed.

29 Claims, 18 Drawing Sheets

VECTOR MODE
DATA/COLUMN=2 (ATTACKS=105)

FIG.2B
(PRIOR ART)

SPARSE VECTOR MODE
[$A_{VEC}=2$; $A_{UNITS}=3$; $L_{MIN}=0$] (ATTACKS=32)

FIG.6
(PRIOR ART)

VECTOR MODE
(ATTACKS=48)

SPARSE VECTOR MODE
[$A_{VEC}=4$; $A_{UNITS}=3$; $L_{MIN}=0$; $W_{LESS}=0.25$]
(ATTACKS=37)

FIG.10
(PRIOR ART)

VECTOR MODE
(ATTACKS=58)

SPARSE VECTOR RASTERIZATION

FIELD OF THE INVENTION

This invention relates to digital oscilloscope displays, and more particularly to methods for processing acquired waveform data to produce gray scale raster scan displays for such oscilloscopes.

CROSS-REFERENCE TO RELATED APPLICATIONS

[not applicable]

STATEMENT REGARDING FEDERALLY SPONSORED RESEARCH AND DEVELOPMENT

[not applicable]

BACKGROUND OF THE INVENTION

Digital oscilloscopes generally use raster scan displays to present the activity of electrical signals to their users. Each raster scan display, such as those we see every day in computer screens, consists of a two dimensional array of pixels, with each pixel location being uniquely defined by a row number and column number. The simplest and lowest cost versions of such displays are "single bit" displays, in that the memory from which they derive the information to be displayed only has one bit of intensity information associated with each pixel. In such a display that single bit of information determines whether the pixel associated with it is either "on" or "off", with "on" dictating that a predetermined amount of intensity is to be used to illuminate the pixel and "off" indicating that the pixel is not to be illuminated at all.

The more complex and expensive alternative to a single bit display is a multi-bit or gray-scale display. The memory locations associated with each bit of a gray scale display contains multiple bits of intensity information, indicating which of a number of intensity levels with which they can be illuminated. Like the pixels of single bit displays, those of multi-bit displays can exhibit an "off" or dark state, but instead of one value of illumination, they have multiple values. Typically, the number of values available is $2^N-1$, where N is the memory depth at each address of the raster memory. Thus, for example, a four bit deep raster scan memory can support fifteen levels of partial through maximum illumination, as well as the dark or "off" state.

With this larger amount of data, multi-bit displays can convey more information about the behavior of electrical signal waveforms under observation, particularly if the signal is not perfectly repetitive and therefore has less activity in some portions than others. U.S. Pat. No. 4,940,931 to Katayama et al. for "Digital Waveform Measuring Apparatus Having A Shading-tone Display", hereby incorporated by reference, describes a system for producing digital gray scale displays.

Multi-bit intensity information also makes it possible to create analog-like "persistence" effects, i.e., the decay of signal intensity over time. In the older analog oscilloscopes, persistence was a decay of the illumination of the cathode ray tube (CRT) that was a function of the type of phosphor used in the construction of the CRT and the voltages applied to different elements of that tube. In digital oscilloscopes, a persistence decay function can be implemented by decrementing the intensity value associated with each illuminated pixel according to some algorithm. U.S. Pat. No. 4,504,827 to Hanson et al. for "Synthetic Persistence for Raster Scan Displays", hereby incorporated by reference, describes a method for pseudo randomly decrementing intensity data in a raster scan display. U.S. Pat. No. 5,254,983 to Long et al. for "Digitally Synthesized Gray Scale for Raster Scan Oscilloscope Display", hereby incorporated by reference, describes one approach for persistence-like decay of acquired waveforms stored as digital numbers. U.S. Pat. No. 5,387,896 to Alappat et al. for "Rasterscan Display with Adaptive Decay", hereby incorporated by reference, describes a system for rasterization that operates on a local pixel in one of two ways, depending on a calculation based on that pixel's initial value.

Typically, digital oscilloscopes acquire information about the behavior of a waveform by periodically sampling the voltage present at the point where a probe is in contact with some node of a circuit under observation. The oscilloscope probe and front end of the oscilloscope are designed to precisely replicate the signal, or some predetermined faction or multiple of the signal, and present it to an analog-to-digital converter. The output of the analog-to-digital converter is a series of multi-bit digital words that are stored in an acquisition memory. Successively acquired samples are stored at sequentially related addresses in the acquisition memory, and are thereby related to a time scale. Those addresses will eventually be converted back to a time scale, one of which is represented as horizontal distance along the x-axis of the oscilloscope's raster scan display.

As has previously been described, a raster consists of horizontal rows and vertical columns. Each row can be identified by a location number along the vertical axis (y-axis), while each column can be identified by a location number along the horizontal axis (x-axis). Typically, in an oscilloscope, voltage amplitude values derived from the data contents of an acquisition memory location determine the vertical location (row number) of an illuminated pixel, while time values derived from the addresses of the acquisition memory determine the horizontal location (column number). The process of expanding the contents and addresses of an acquisition memory to produce contents for a two dimensional raster memory is known as "rasterization".

The digital contents of an acquisition memory, as well as the time significance of successive addresses in that memory, need only be proportional to the voltage and time values that they represent. The acquisition and display settings of the instrument will determine the actual voltage and time values that they represent, and will determine the scaling functions that will be applied as the data is mapped into the raster memory.

For any particular combination of settings of the oscilloscope display and acquired waveform data, there will be some function that maps the acquired data points into the time (x-axis) versus voltage (y-axis) display raster. That mapping function will include some ratio between the number of samples to be mapped and the number of pixel columns in the raster display. While that ratio can be 1:1, it will usually be N:1 or 1:N If there are more data points than columns of pixels into which they must be mapped, some form of data compression will have to be utilized. At its simplest, this could mean discarding all but every Nth data points (known as "decimation"), although this means losing some of the information content available in the original data set.

If the raster memory into which the acquired data is being mapped has multiple bits associated with each pixel location, that is supports gray scale illumination values, then multiple "attacks" (also known as "hits") on the same pixel can be differentiated from single attacks, or a different numbers of attacks, by intensity variation (brightness differences) in the display. In single bit displays, such differentiation is not possible, since each pixel is limited to being either on or off, i.e., illuminated or not illuminated. FIGS. 1A–C, 2A–C, 5, 6, 9, and 10 all illustrate single-bit rasterization outputs. The pixels identified with the "D"s and "R"s in these figures are all illuminated to the same approximate level. As will be further discussed below, these "D"s and "R"s's refer to the source of the decision to illuminate a particular pixel and do not have anything to do with that pixel's intensity.

Digital oscilloscope displays have historically mapped and presented the acquired waveform data in one of two basic ways, known as "dot mode rasterization" and "vector mode rasterization", with the latter also being known as "vectorization". FIGS. 1A, 1B and 1C illustrate dot mode rasterization of a sinusoidal waveform. In FIG. 1A, approximately 1.5 cycles of this waveform are represented by 20 waveform data points from the acquisition memory. Because of the one-to-one relationship between input data and raster pixel columns, no data compression or expansion was required and the 20 acquired data points mapped directly into the 20 pixel columns shown. The pixels that are made active by this process are designated with a "D", which refers both to correspondence with an actual data point and, in this case, the output of the dot mode process.

FIG. 1B shows dot mode rasterization of similar waveform data, but in FIG. 1B three cycles are shown mapped by 2:1 compression. As can be seen in these figures, in dot mode only pixels that are directly "attacked" by the rasterization mapping function are illuminated or have their intensity values increased, and the other pixels in the raster display are unaffected. FIG. 1C also illustrates dot mode rasterization, but it shows approximately three quarters of a cycle with 1:2 expansion.

Referring next to FIGS. 2A and 2B, these figures show vector mode rasterization of the same input data that was used for dot mode rasterization in FIGS. 1A and 1B. As can be seen in FIGS. 2A and 2B, vector mode rasterization "attacks" (i.e., turns on or increases the illumination of) all of the pixels that are between those pixels that would be attacked in dot mode. In these Figures, pixels corresponding to actual acquired data are indicated with "D"s, while those supplied by the rasterization process are indicated with "R"s. Nonetheless, both sets of pixels are equally illuminated, and the resulting bit-map raster image can be described with a single bit per pixel.

The output of a rasterization process is usually combined with some preexisting content of a raster memory, and the resulting composite raster contents may thereafter be regularly subjected to some sort of decay process. For more information in this area, refer to the following U.S. Patents, hereby incorporated by reference: U.S. Pat. No. 5,440,676 to Alappat et al. for "Raster Scan Waveform Display Rasterizer With Pixel Intensity Gradation"; U.S. Pat. No. 5,387,896 to Alappat et al. for "Rasterscan Display With Adaptive Decay"; U.S. Pat. No. 5,254,983 to Long et al. for "Digitally Synthesized Gray Scale For Raster Scan Oscilloscope Displays"; Digital Waveform Measuring Apparatus Having A Shading-Tone Display Function";

It should be noted that the rasterization process is generally performed on only one column of information at a time. The input to this process is typically the vertical coordinate of the current point in this column and the vertical coordinate of the next point. These vertical coordinates are derived from the data portion of the data-address pairs in the acquisition memory. The column being updated is determined by the address part of the same data-address pair. Since the mapping of data addresses into pixel columns can be many-to-one, one-to-one, or one-to-many, the "next" point referred to above can be associated with the next column, as it is in FIG. 1A, or the same column, as is the case part of the time in FIG. 1B. When the next column does not have a data point that maps directly into it, a horizontal interpolator external to the rasterizer can determine one and supply it to the rasterizer. The rasterizer treats these horizontally interpolated points in the same manner as its other inputs coming directly from data-address pairs.

The determination of which mode of rasterization is preferable in a particular situation, dot mode or vector mode, is frequently determined by the waveform input rate. Digital oscilloscopes acquire waveform data in response to a "trigger" event. While triggers can be based on more complex events, typically a trigger is generated when the amplitude of the signal under observation crosses an amplitude threshold in a particular direction. Usually the amplitude and direction of the triggering event is determined by the oscilloscope operator, but it can also be automatically provided by some oscilloscopes, at least in certain modes of operation. Typically, the operator finds a trigger level and direction that seems suitable for seeing the portion of the signal that he or she is interested in, and then makes timebase, vertical amplitude, and brightness adjustments, and possibly further trigger level adjustments, in an iterative manner, until a satisfactory waveform image is produced on the display.

If triggering events are occurring rapidly, the oscilloscope may have to ignore some of them because it hasn't had sufficient time as yet to process and display the data from the last acquisition. Since vectorization can slow the analyzing and displaying process, waveform throughput is usually reduced when vector mode is selected. Thus, while vector mode operation produces the best waveform image, dot mode best allows for more waveform throughput.

If there are sufficient triggers and waveforms, and the oscilloscope's data handling capabilities are adequate, dot mode rasterization will generally provide a suitable waveform display. Conversely, if the trigger rate is low and the oscilloscope has sufficient time to do the processing of each waveform, vector mode rasterization will generally provide the best picture of the waveform. However, there are times when the waveform acquisition rate is intermediate and neither dot mode nor vector mode is fully adequate to the task of providing the optimum waveform display. Under these circumstances the operator can manually switch back and forth between dot and vector modes, but may find that neither mode is truly suitable for producing an optimal display. The goal of the invention described below is to provide a suitable alternative under these circumstances.

As further background, it should be noted that for many years, digital oscilloscopes were limited in the percentage of activity at the probe tip that they effectively processed and displayed for the user. Although less sophisticated users and those who were only familiar with analog oscilloscopes had the impression that they were seeing most or all of the activity at their digital oscilloscope's probe tip, in many circumstances the display was really only showing a small percentage of the actual activity occurring there. This was because these oscilloscopes spent a lot more time processing signals than they did acquiring them. If a signal is perfectly repetitive, this loss of "live time" is not a problem, since one waveform looks just like another. However, when a signal is displaying some sort of intermittent anomalous behavior, a low percentage of live time may prevent such an anomaly from being detected. Therefore, increasing the waveform throughput and the percentage of signal activity at the probe tip that can actually be observed by the user has been the goal of some of the more recent digital oscilloscope designs. U.S. Pat. No. 5,412,579 to Meadows, et al. for "Slow Display Method for Digital Oscilloscope With Fast Acquisition System", hereby incorporated by reference, describes an oscilloscope system in which acquisitions are composited into alternating (also known as "ping-ponging") display buffers, so that while the contents of one display buffer is being used to display data to the user, the other one is being used to gather and composite more data. However, the slow display of this design only provided a single bit of intensity data per pixel and therefore had no analog-like gray scaling capability.

Other oscilloscopes had been successfully producing gray scale displays, but those displays were based on a relatively low throughput of underlying waveforms. As was described above, the decay time of this digital persistence could be varied to provide an operator control similar to those available with analog oscilloscope displays. With the digital persistence feature turned off, the display exhibited "infinite persistence", in which variations in the incoming acquired waveforms could add to the number of pixels illuminated or to their brightness, but nothing diminished their brightness or made them go back to being not illuminated. Thus, over time, every affected pixel reached maximum intensity.

As has been stated above, increasing "live time" at the probe tip and the capability of processing a large number of waveforms is a highly desirable feature in a digital oscilloscope. U.S. Pat. No. 5,530,454 to Etheridge et al. for "Digital Oscilloscope Architecture For Signal Monitoring With Enhanced Duty Cycle", herein incorporated by reference, describes an oscilloscope that is capable of acquiring up to 400,000 waveforms per second. This oscilloscope rivaled analog oscilloscope performance with a "live time" percentage that varied from about 50% to nearly 99%, depending on the timebase settings. This speed was attained by using two raster memories, one in the acquisition system and the other in the display system. The first of these raster memories, referred to as the "raster acquisition memory", was almost constantly supplied with acquired waveforms, which were composited into the raster acquisition memory by an acquisition rasterizer and an image combiner. After many waveforms had been thus composited, the contents of the single-bit per pixel raster acquisition memory was shipped to a multiple bit per pixel display raster memory, where it was combined with previously displayed data. That display raster memory was also subject to a digital persistence control, such as that described above. While an oscilloscope build in accordance with the teachings of the Etheridge '454 patent accomplished very high waveform throughput and produced a very nice display, that design relied on a great deal of fast and expensive hardware for its success. Lower cost rasterizers typically require operating time in direct proportion to the number of pixels whose intensities are being affected by the rasterization process.

For many users, especially those having some experience with analog oscilloscopes, variable brightness usefully communicates information about the activity of the signal being observed. For example, an intermittent signal anomaly that occurs in an otherwise repetitive signal at the rate of about one in ten times will show up clearly in this type of analog display, but its brightness will be significantly less than the brightness of the main signal which occurs the other nine out of ten times. Of course, if the signal becomes too intermittent, it will be so faint in brightness that it may be missed entirely by the oscilloscope operator.

In U.S. Pat. No. 5,412,579 to Meadows, et al. for "Slow Display Method for Digital Oscilloscope With Fast Acquisition System", incorporated by reference above, the two single bit per pixel raster memories were used in a way that gave the operator some indication of the presence of intermittent signals. This was accomplished by using a randomizing process to qualify the compositing of the most recent waveform into the previously accumulated waveforms. With this approach, waveforms that were sufficiently intermittent only showed up as dotted lines, while waveforms that occurred most of the time would generally appear as completely filled in. Because of the single bit per pixel limitation of this implementation, extremely rare and not-so rare waveforms would tend to be misidentified., respectively, as not discernable or as always present.

Multi-bit, gray-scale implementations of a display raster's memory provide a way around the limitation described immediately above. In a system such as that described in U.S. Pat. No. 5,530,454 to Etheridge et al., discussed and incorporated by reference above, intermittent behavior can be made to appear in a very realistic analog-like manner because infrequently attacked pixels never reach the same intensity values as those that are attacked more regularly. If digital persistence is active, all of the pixels that have become active by being attacked will be decayed according to some appropriate function, but the rarely attacked pixels will have their intensities increased less often and will therefore always appear to be dimmer than those that are attacked during almost every rasterization.

Beyond the improvements in the ability of digital oscilloscopes thus far described, in some circumstances, some oscilloscope users also have had a strong preference for another behavior that resembles that of analog oscilloscopes, "slope responsive vectoring". As analog oscilloscopes generate vertical excursions during a horizontal sweep interval to provide a real-time picture of the signal activity at the probe tip, they inherently tend to vary the brightness of the display as an inverse function of the slope of the line they produce. This occurs because the cathode electron gun of the CRT generates a constant supply of electrons that depends on the setting of a "brightness" control.

Because this supply of electrons is constant, and because the horizontal motion of the electron beam is constant, the perceived "brightness", or intensity of the display, varies inversely with the amount of vertical activity of the signal. If there is no vertical motion, all of the electron energy produced over a particular interval of time is channeled into a short horizontal line that appears relatively bright. On the other hand, if there is a lot of vertical motion within that same interval of time, that same amount of energy is spread out over the much longer line that is produced during that equivalent interval of time. While this can make rapidly rising vertical edges difficult to see, it gives the user "a feel" for the signal activity that can be lost in digital displays that are either more uniformly bright or sparsely populated with discrete dots. A system that produces a display that is analog-like in this respect is described in U.S. Pat. No. 5,550,963 to Siegel et al. for "Graded Display of Digitally Compressed Waveforms", hereby incorporated by reference.

To summarize that which has been stated above, and to make clear the need for the invention to be described below, oscilloscope manufacturers, in order to best meet the needs of oscilloscope users, have long been attempting to achieve "the best of both worlds" by producing digital oscilloscopes that retain the benefits inherent in being able to store and process acquired data after acquisition, while at the same time more successfully emulating those features of analog oscilloscope displays that best communicate information about the signal under observation. While much progress has been made in this direction, one of the most resistant artifacts of the digital, raster scan based approach to conveying waveform information has been the sharp dichotomy between the use of the dot mode and vector mode approaches to rasterization. Because there is time overhead associated with the read-modify-write activity involved in updating the memory location associated with each active pixel, vector mode rasterization usually takes much more time than does dot mode rasterization, and yet in many circumstances dot mode rasterization provides an inadequate waveform image. This is an especially frustrating problem when waveforms and triggers are fairly plentiful and the oscilloscope can acquire them rapidly enough to provide adequate capture of rare events, but there is not sufficient time to fully vectorize all of those waveforms and there is also not enough data, especially in non-repetitive portions of the waveforms, to make an adequate dot mode display that gives the user visibility of the information that he or she needs.

BRIEF SUMMARY OF THE INVENTION

In accordance with the invention, a method for rasterization of a set of voltage-versus-time data-address pairs into horizontal and vertical locations of a multi-bit raster display memory of a digital oscilloscope or similar electronic data acquisition instrument is disclosed. This method provides a new way of controlling digital intensity, by allowing a function based on the instrument's trigger rate to set the maximum number of pixels to be modified in drawing each vector while an operator controlled parameter determines the number of intensity units available for each modification. If a vector has more pixels than the maximum number of pixels to be modified, the pixels that are modified are spread out over the vector's length by an algorithm that preferably includes at least some degree of randomization. If there are more pixel modifications available than there are pixels in that vector, the extra brightness (intensity) content that they represent can either be distributed along the pixels available for modification in that vector or it can be ignored and discarded. If the vector has no length, all of the available intensity, or some lesser amount of intensity, is put on one pixel. Setting a small minimum vector length, below which only limited vector filling is used, can save time by limiting the amount spent on insignificant details. Setting maximum and minimum intensity levels for those pixels that are affected by the rasterization process can limit saturation at one extreme and assure that areas that receive only one or a few attacks will still have an intensity level that is bright enough to be perceptible at the other. Sparse vector rasterization avoids the hard binary choice between using a dot mode or a vector mode, and gives the user an analog-like intensity control that produces a perceived continuum of viewing choices. It does this while maximizing the number of pixels updated within the context of how many waveforms are being acquired and need to be processed.

BRIEF DESCRIPTION OF THE DRAWINGS

FIG. 2B is an illustration of a (prior art) single-value vector mode rasterization of of the same waveform data that was the input to FIG. 1B.

FIG. 6 is an illustration of a (prior art) single-value vector mode rasterization of the same pulse signal shown in FIG. 5.

FIG. 10 is an illustration of a (prior art) single-value vector mode rasterization of the same input waveform as shown rasterized in dot mode in FIG. 9.

DETAILED DESCRIPTION OF THE INVENTION

The following discussion will rely heavily on figures containing illustrations of rasterizer outputs. However, due to space limitations and the need to focus on details, it must be understood that these illustrations, which only have 20 rows and 20 columns, are much smaller than any actual full size raster scan displays, which are generally on the order 400×500 pixels. These displays therefore appear to be considerably more granular than the comparable images would be if they were full size. It should also be stated that the preferred distribution of interpolated points in sparse vector generation is, at least in part, random, with a constant interval indexed by a random offset value. In practice the operations shown here only once will actually be performed a very large number of times, so that the laws of probability operating on large numbers of events will have a chance to eliminate the granularity that appears in these "snapshot" examples.

Figure 1A:
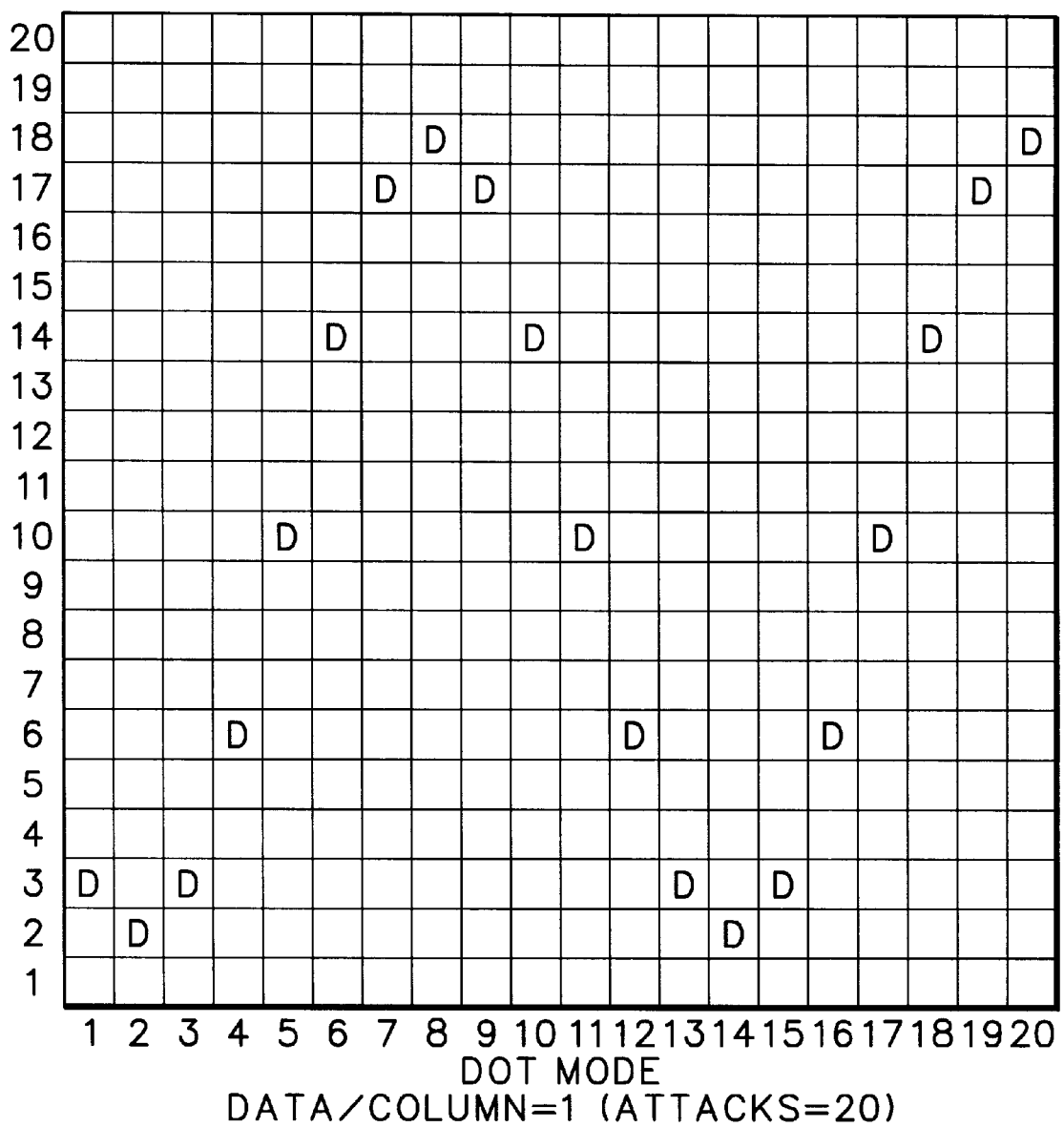
FIG. 1A is an illustration of a (prior art) single-value dot mode rasterization of approximately one and one half cycles of a sinusoidal waveform, the input to this rasterization having had a single acquired waveform data point per raster pixel column in the output.

Referring to FIG. 1A, this is an illustration of the results of a dot mode rasterization, according to the prior art, of approximately one and one half cycles of a sinusoidal waveform. Twenty acquired waveform data points in the input have been mapped as twenty dots of amplitude versus time information in the output seen here. This output is single-valued, meaning that the intensity of each dot, represented as an "D" in this illustration, is the same.

Figure 1B:
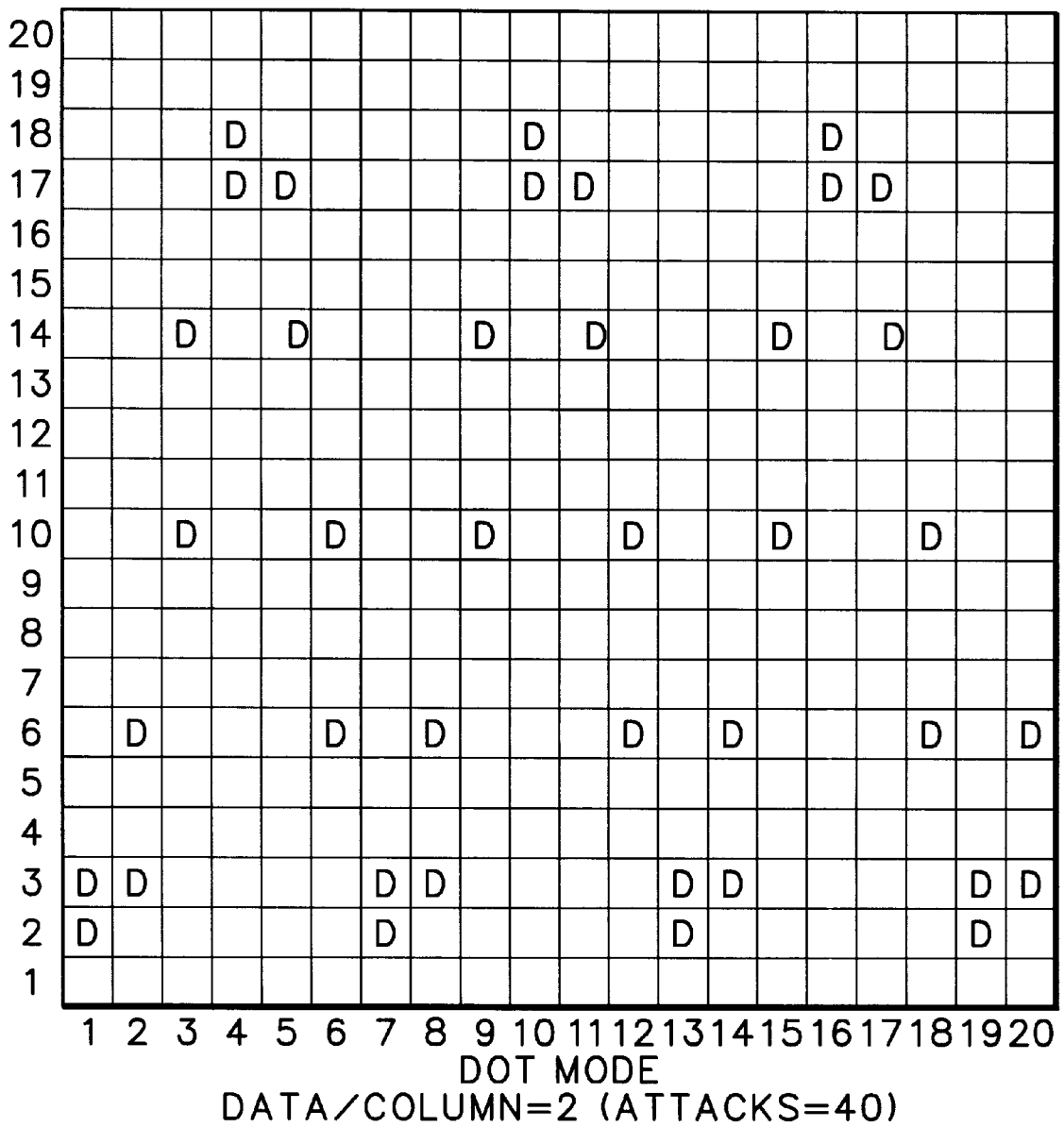
FIG. 1B is an illustration of a (prior art) single-value dot mode rasterization of approximately three cycles of a sinusoidal waveform, the input to this rasterization having had two acquired waveform data points per raster pixel column in the output.

Referring next to FIG. 1B, this is another illustration of a prior art dot mode rasterization of the same type as is shown in FIG. 1A, except that here there were twice as many input waveform data points, i.e., 40, as there are pixel columns in the output, i.e., 20. This two-to-one compression permits twice as much time, or approximately three cycles of the same sinusoidal waveform, to be displayed along the horizontal axis. Again, the output is single-valued, meaning that each pixel is illuminated with the same intensity in response to this raster memory image.

Figure 1C:
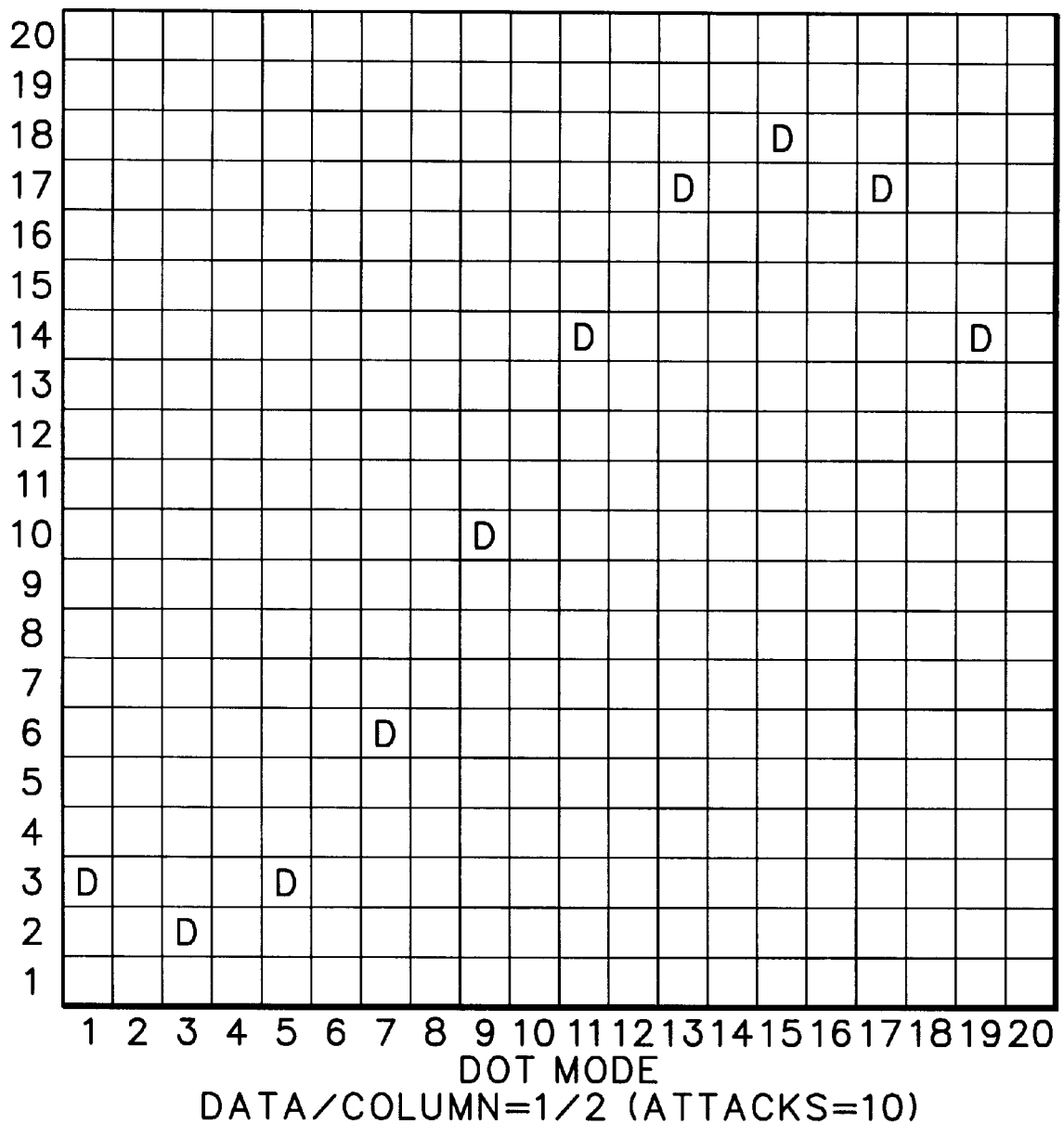
FIG. 1C is an illustration of a (prior art) single-value dot mode rasterization of approximately three quarters of one cycle of a sinusoidal waveform, the input to this rasterization having had one acquired waveform data point per two raster pixel columns in the output.

Referring next to FIG. 1C, this is another illustration of a prior art dot mode rasterization of the same type as is shown in FIGS. 1A and 1B, except that here there were half as many input waveform data points, i.e., 10, as there are pixel columns in the output, i.e., 20. This one-to-two expansion provides for half as much time, or approximately three quarters of a cycle of the same sinusoidal waveform, to be displayed along the horizontal axis. Again, the output is single-valued, meaning that each pixel is illuminated with the same intensity in response to this raster memory image.

Figure 2A:
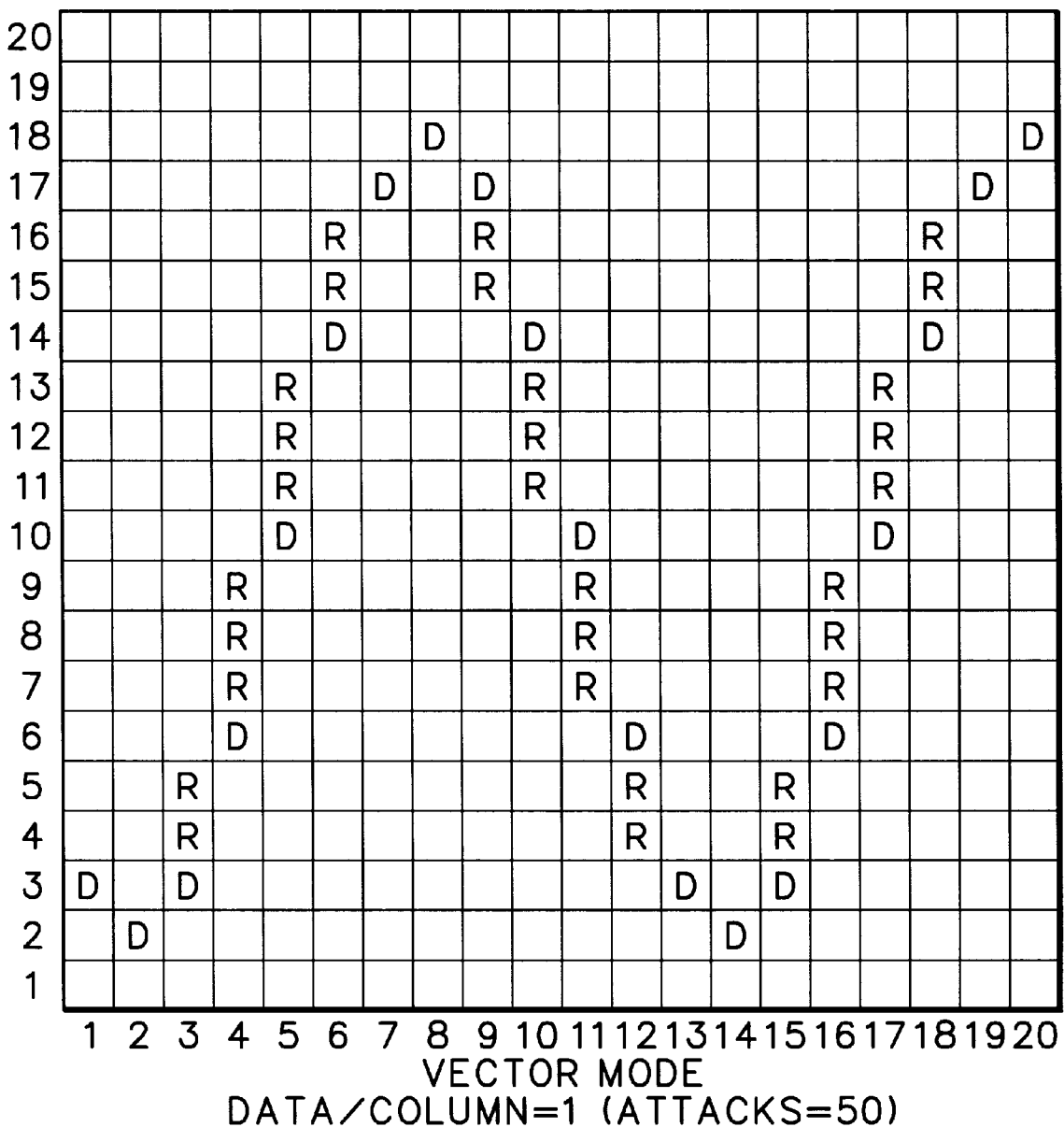
FIG. 2A is an illustration of a (prior art) single-value vector mode rasterization of the same waveform data that was the input to FIG. 1A.
Figure 2B:
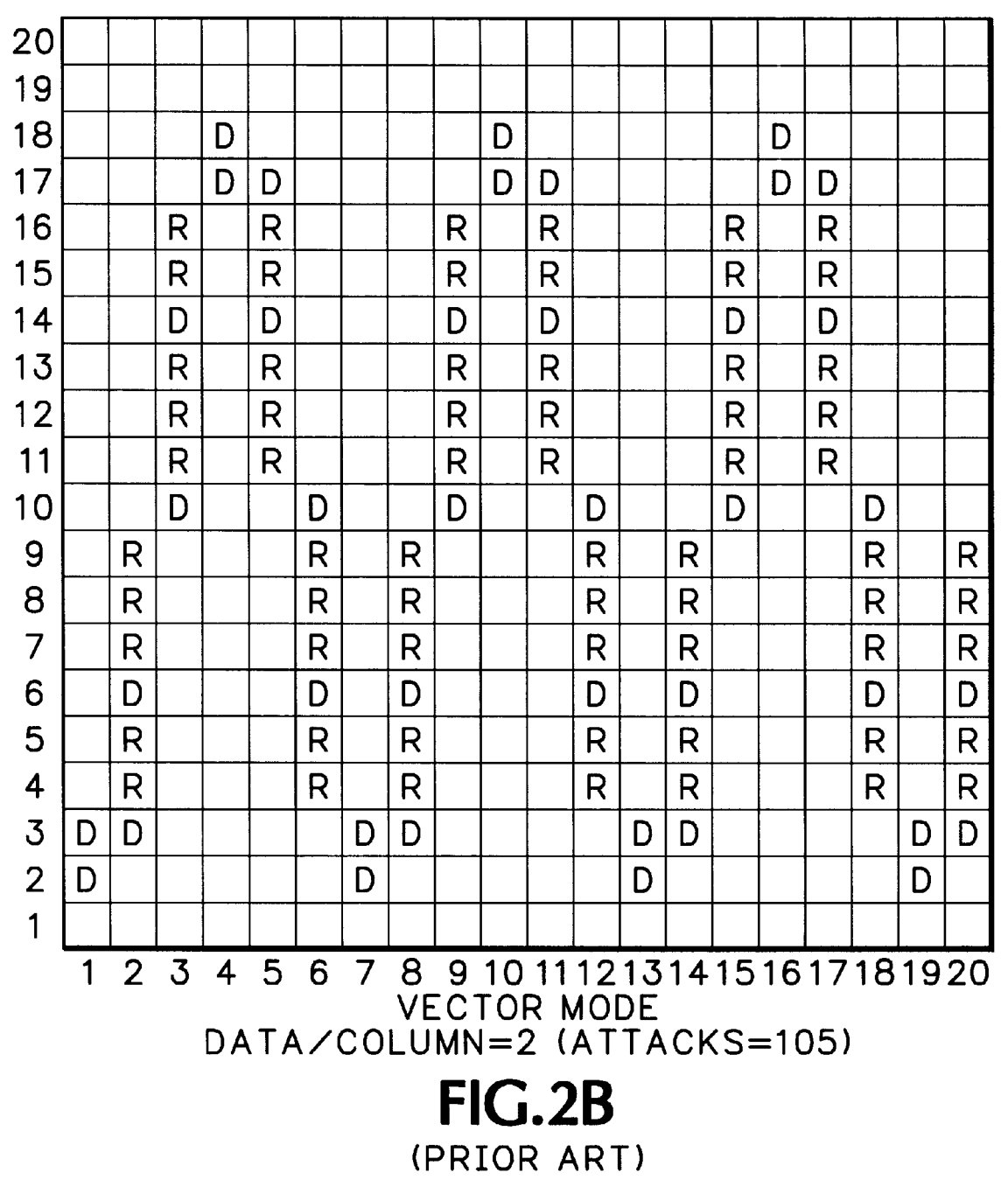
Figure 2C:
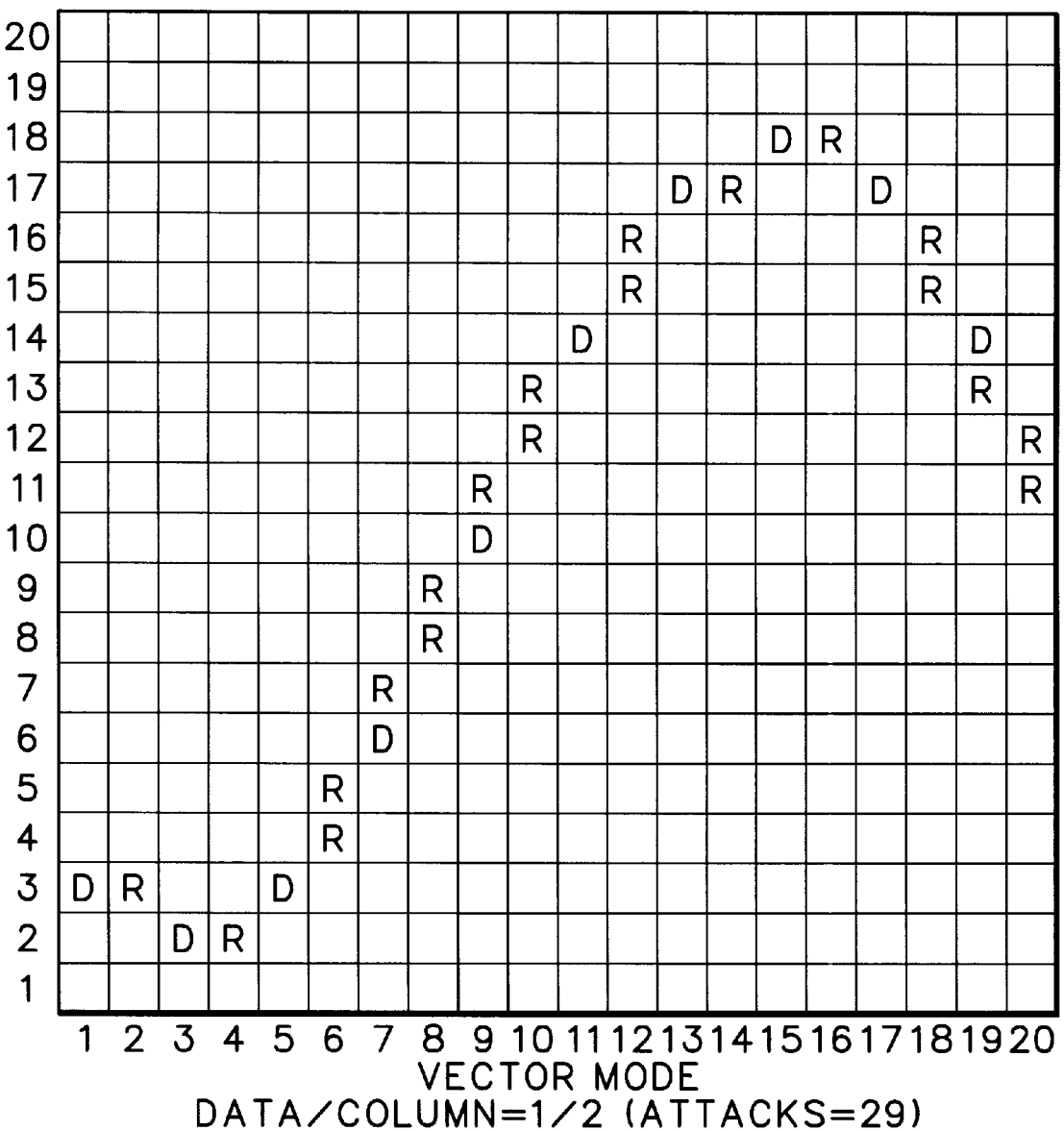
FIG. 2C is an illustration of a (prior art) single-value vector mode rasterization of of the same waveform data that was the input to FIG. 1C.

Referring now to FIGS. 2A, 2B and 2C, these figures show vector mode rasterizations of the same waveforms as are shown after dot mode rasterization in FIGS. 1A, 1B and 1C, respectively. The vector mode rasterization output shown in FIG. 2A has 50 (single-value) active pixels, as compared with the 20 active pixels produced by the dot mode rasterization output shown in FIG. 1A. The vector mode rasterization output shown in FIG. 2B, with twice as much time along its horizontal axis (as compared with FIG. 2A), contains 105 active pixels, as compared with the 40 active pixels produced by the dot mode rasterization output shown in FIG. 1B. The vector mode rasterization output shown in FIG. 2C, with half as much time along its horizontal axis (as compared with FIG. 2A), contains 29 active pixels, as compared with the 10 active pixels produced by the dot mode rasterization output shown in FIG. 1C. Thus, it can be seen that prior art vector mode rasterization (i.e., vectorization) produces many more active pixels than does dot mode rasterization of the same waveforms. Therefore, in situations where there is time overhead associated with the read-modify-write activity involved in updating the memory location associated with each active pixel, vector mode rasterization can take much more time than does dot mode rasterization.

Figure 3A:
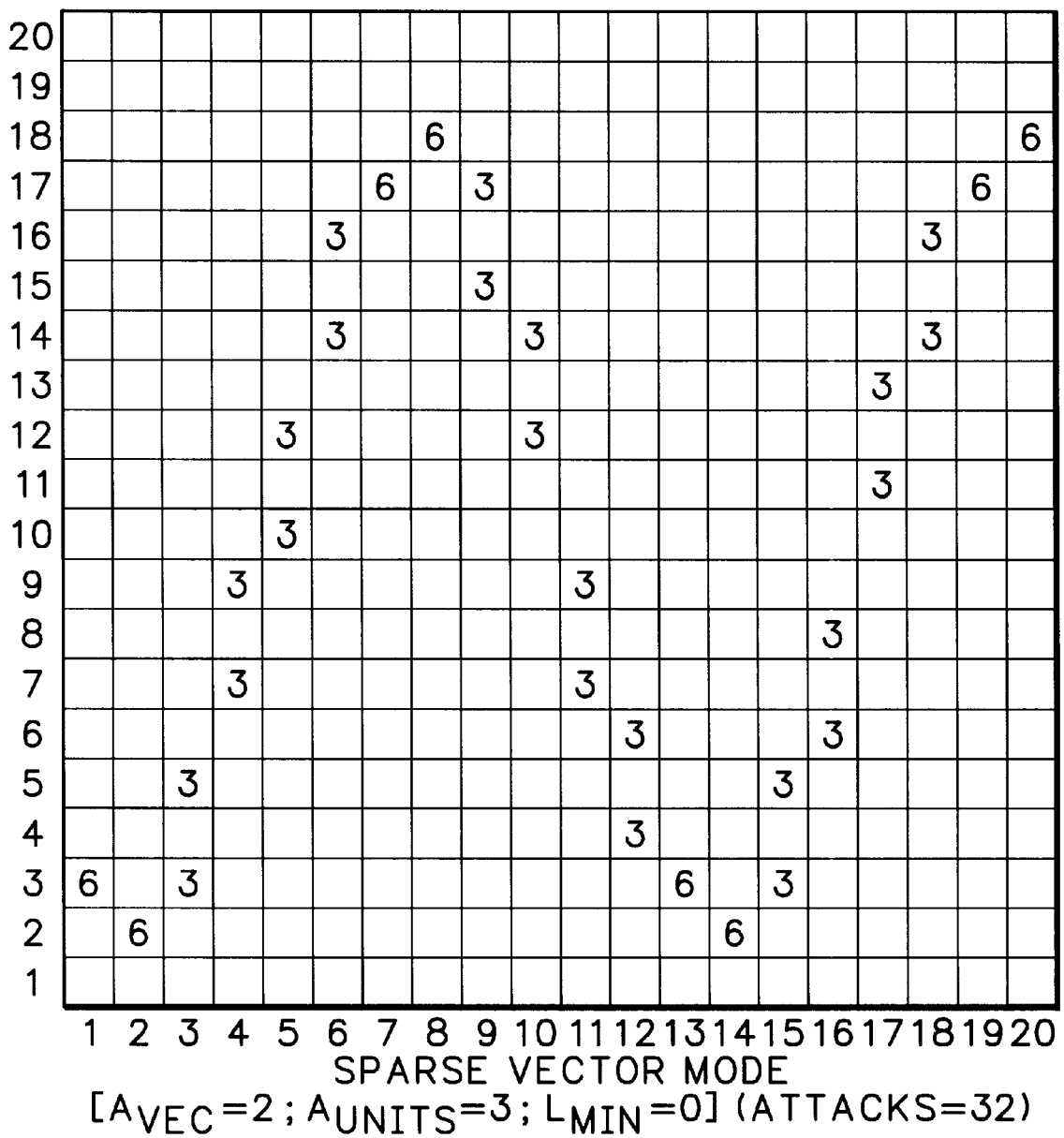
FIG. 3A is an illustration of a multi-value sparse vector mode rasterization according to the present invention of the same waveform that was input in FIGS. 1A and 2A, with the following settings for the control parameters of the rasterizer inputs: $A_{VEC}=2$, $A_{UNITS}=3$, and $L_{MIN}=0$.
Figure 3B:
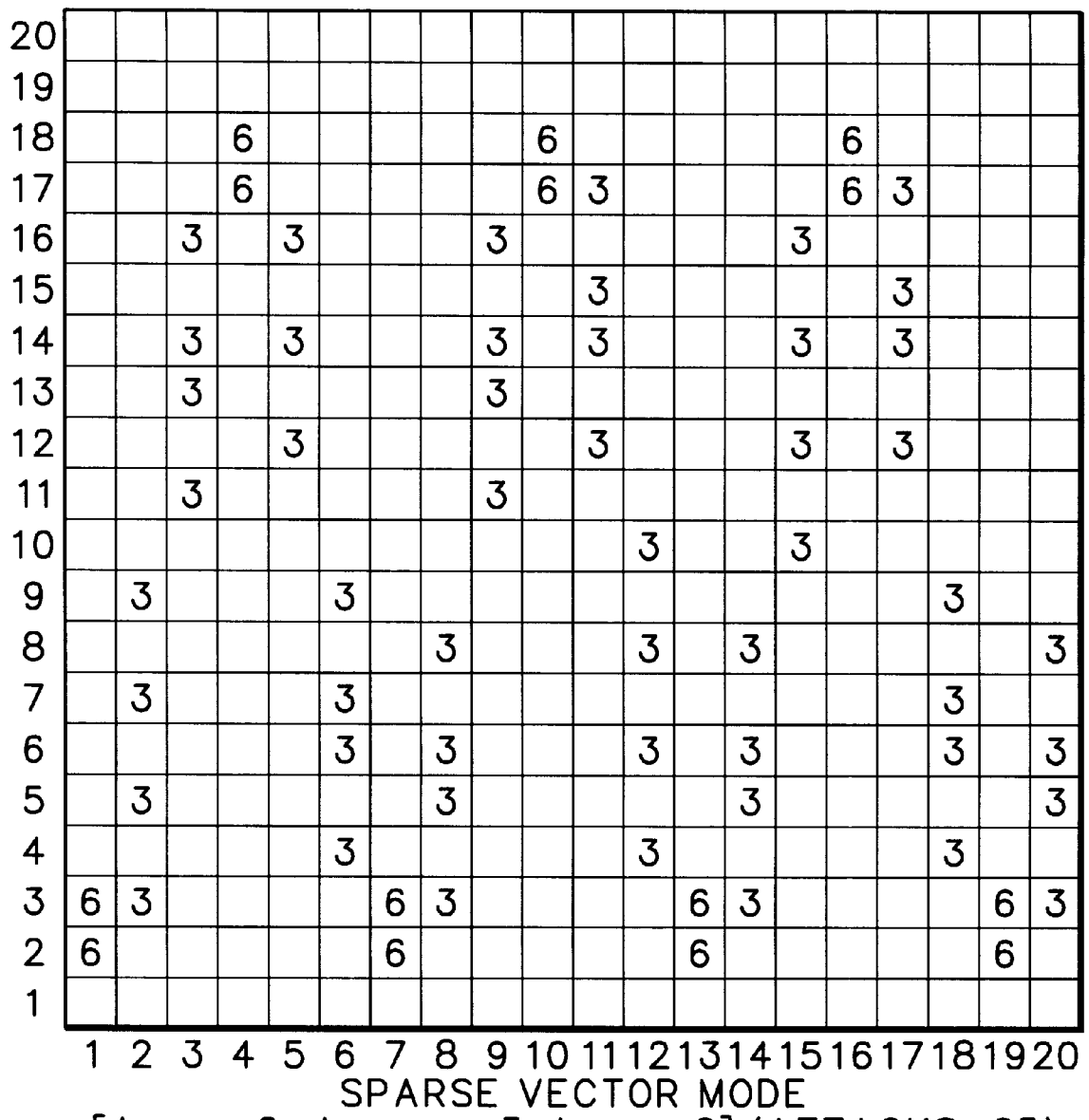
FIG. 3B is an illustration of a multi-value sparse vector mode rasterization according to the present invention of the same waveform that was input in FIGS. 1B and 2B, with the following settings for the control parameters of the rasterizer inputs: with $A_{VEC}=2$, $A_{UNITS}=3$, and $L_{MIN}=0$.
Figure 3C:
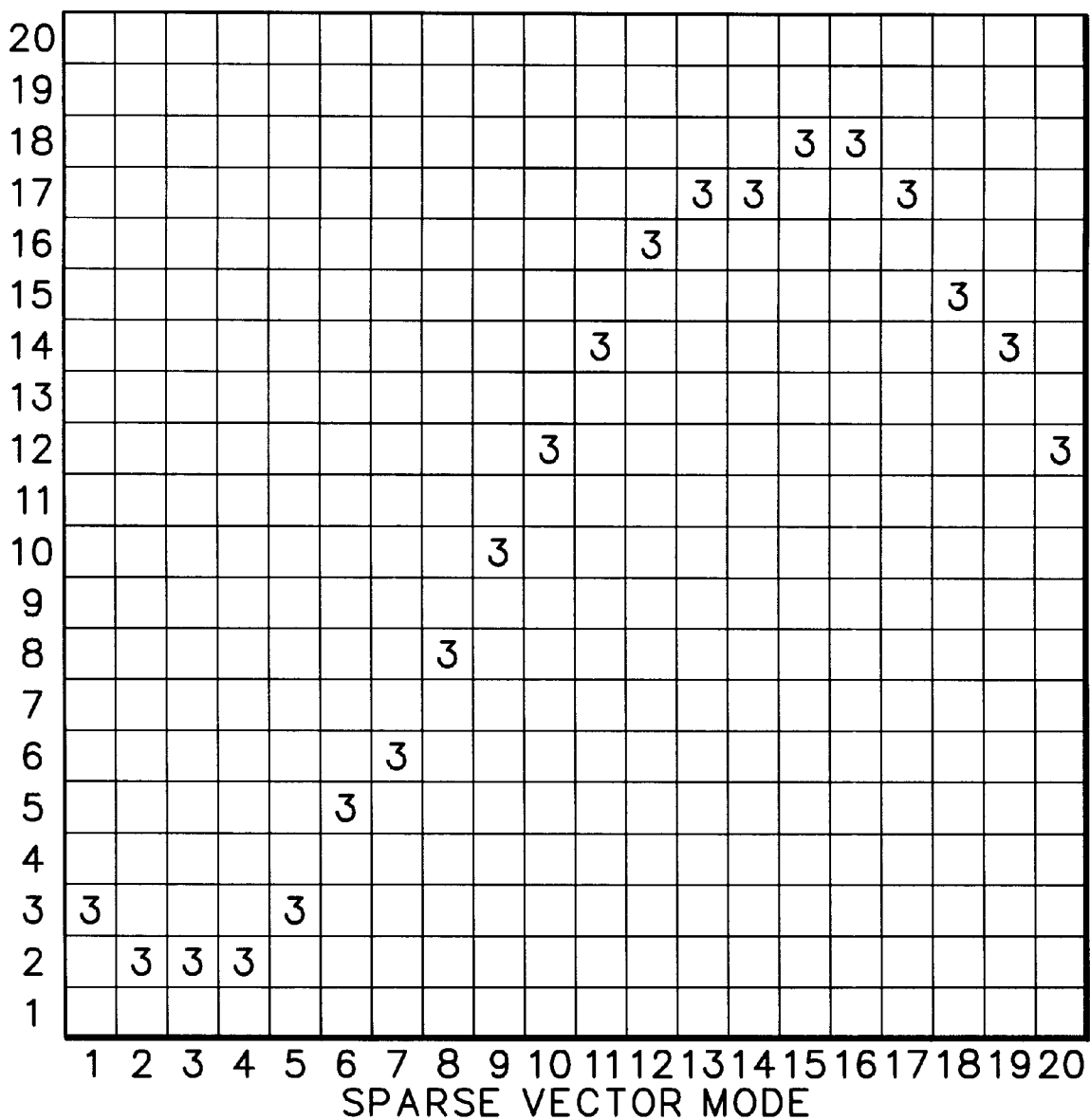
FIG. 3C is an illustration of a multi-value sparse vector mode rasterization according to the present invention of the same waveform that was input in FIGS. 1C and 2C, with the following settings for the control parameters of the rasterizer inputs: with $A_{VEC}=2$, $A_{UNITS}=3$, and $L_{MIN}=0$.

Referring next to FIG. 3A, we now see a multi-value raster output produced by "sparse vector mode" rasterization according to the present invention. The input here was the same as that which produced the dot mode output shown in FIG. 1A and the vector mode output shown in FIG. 2A. However in this output, produced by sparse vector rasterization, there are only 34 active ("attacked") pixels, as compared with the 50 active pixels produced by normal (full) vector mode of the prior art. Similarly, FIG. 3B shows outputs based on sparse vector mode rasterization of the same input as was the input to the normal vector mode rasterization output shown in FIG. 2B. For the three cycle input that produced 105 active pixels in the vector mode output shown in FIG. 2B, we here see only 65 active pixels produced by the sparse vector mode. In FIG. 3C there is no difference in the number of pixels attacked, as compared with FIG. 2C.

The sparse vector rasterization outputs shown in FIGS. 3A and 3B are "multi-value", in that their active pixels contain more than one level of non-zero intensity, in this case "3" and "6", since in this example, the assigned number of attacks per vector is "2", i.e., $A_{VEC}=2$, and the units of intensity per attack is "3", i.e., $A_{UNITS}=3$. These settings and their significance will be further discussed below, but we note here that an "attack" will refer to the modification of the content of pixel location in a raster display memory, e.g., by a read-modify-write sequence of operations that has the effect of increasing the number of units of intensity that the related pixel is to receive on the display.

Because of the limited size of FIGS. 1A–3C (i.e., 20×20 pixels), used for these examples, $A_{VEC}$ was chosen to be a very small number, i.e., "2". This allowed these small examples to illustrate "sparseness", i.e., some pixels in the vector that receive no intensity. In a raster display having a more realistic size, e.g., 400×500 pixels, the maximum size of $A_{VEC}$ would be much larger, e.g., 511 or 1023, to allow for full vectorization of infrequent waveforms and very sparse vectorization of plentiful ones.

Figure 4A:
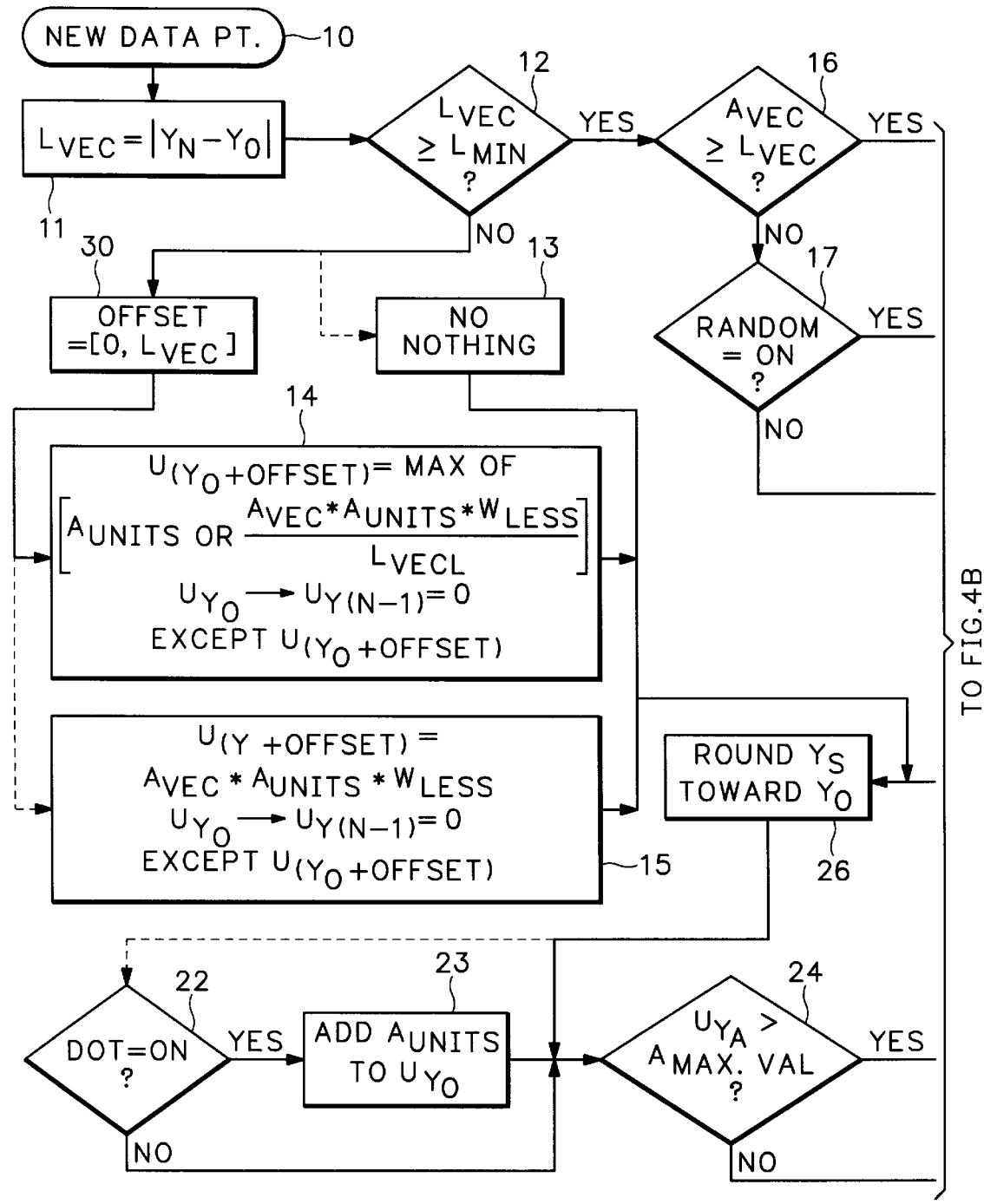
FIG. 4 is a logic flow diagram illustrating the steps involved in a particular implementation of the present invention.
Figure 4B:
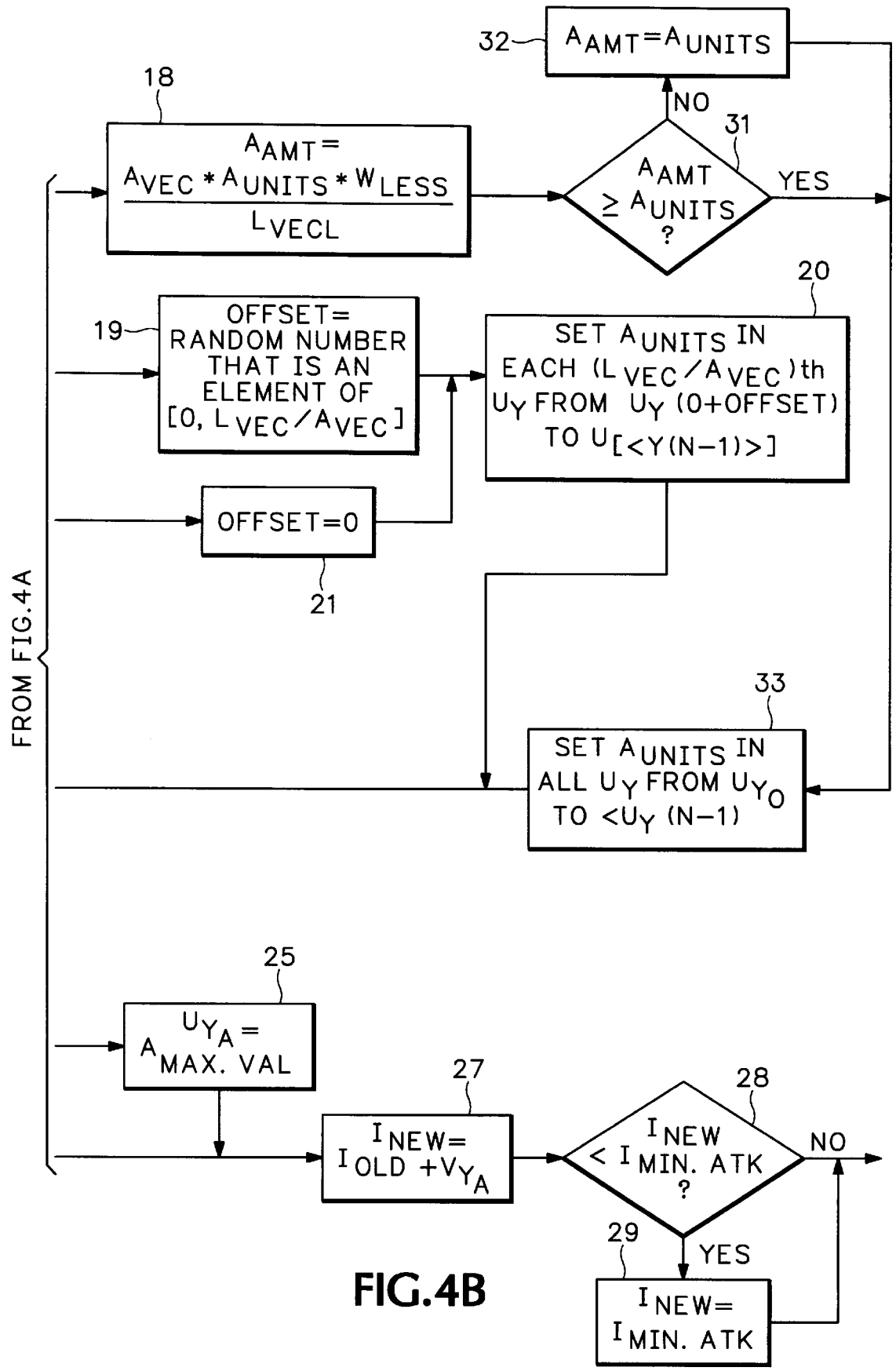

FIG. 4 is a logic flow diagram illustrating the steps involved in a particular implementation of the present sparse vector mode invention. This implementation happened to be performed in hardware, in particular a custom ASIC (application specific integrated circuit), but could also have been accomplished in a variety of hardware styles and technologies, or almost entirely in software. In reading the discussion that follows, it may be convenient to refer to the following Table of Abbreviations.

| TABLE OF ABBREVIATIONS | |
|---|---|
| $A_{AMT}$ | Attack Amount, variable used when $A_{VEC} >= L_{VEC}$ |
| $A_{MAX.VAL}$ | Maximum Value of Attack intensity allowed |
| $A_{UNITS}$ | Units of intensity per Attack |
| $A_{VEC}$ | Assigned number of Attacks per Vector, selected power of 2 |
| $I_{MIN.ATK}$ | Minimum Attack Intensity |
| $I_{NEW}$ | New Intensity of the currently attacked pixel |

-continued

TABLE OF ABBREVIATIONS

| | |
|---|---|
| $I_{OLD}$ | Old Intensity of the currently attacked pixel |
| $L_{MIN}$ | Minimum Length of vector to be fully attacked |
| $L_{VEC}$ | Length of the current Vector, always >= 1 |
| $L_{VECL}$ | Logarithmic form of $L_{VEC}$, used as divisor |
| $U_{YA}$ | Units of prospective additional intensity at attacked location |
| $U_{Y0}$ | Units of prospective additional intensity at location $Y_0$ |
| $U_{Y(0+OFFSET)}$ | Units of prospective additional intensity at location $Y_{(0+OFFSET)}$ |
| $U_{Y1}$ | Units of prospective additional intensity at location $Y_1$ |
| $U_{(Yn-1)}$ | Units of prospective additional intensity at location $Y_{(N-1)}$ |
| $W_{LESS}$ | Weight reduction factor, reducing U values when $A_{VEC}$ >= $L_{VEC}$ |
| $Y_0$ | Y-axis location of the actual data point for this column |
| $Y_N$ | Y-axis location of the Next actual data point |
| $Y_{N-1}$ | Y-axis location of the end of the current vector (Next minus One) |

The assigned number of attacks per vector, $A_{VEC}$, is preferably determined by the trigger rate so that it can then determine how much time spent rasterizing each waveform and therefore react to how fast waveforms are being acquired. The choices of $A_{VEC}$ are limited to powers of two, and most math is done in power of two form.

The units of intensity per attack, $A_{UNITS}$, is preferably determined by the operator so that he or she can control the level of brightness of the display independently of the trigger rate. The goal from the operator's point of view is to make the "feel" of the intensity knob satisfying and as useful as possible. The goal from the rasterizer's point of view is to give as much time and resulting quality to the waveform rasterization process as can be achieved given the present rate of triggering and waveform acquisition.

Referring again to FIG. 4, in the illustrated embodiment, the rasterization process occurs on a column-by-column basis. It starts with a new data point 10, and then the length of the current vector, $L_{VEC}$, measured in pixels, is determined 11 by taking the absolute value of the difference between the y-axis location of the actual data point for this column, $Y_O$, and the y-axis location of the next data point, $Y_N$. The next data point can be in the current column or the next column, and not be an actual acquired data point, but instead could be a horizontally interpolated one if there is not actual acquired data for each column. It should also be noted that $Y_N$ plus one pixel may be used instead of $Y_N$, if it is deemed desirable to have adjacent vectors overlap at their end points. $L_{VEC}$ has a minimum value of one and is approximated as a power of two and called $L_{VECL}$ when acting as a divisor. While the absolute value of $Y_N$-$Y_O$ is needed and used in several places, its sign is maintained and used below to determine the direction of vectors for making rounding decisions.

In decision block 12, the length of the current vector, $L_{VEC}$, is then compared with the minimum length of vector to be fully attacked, $L_{MIN}$. If the length of the current vector is greater than or equal to the minimum vector length, $L_{VEC}$>=$L_{MIN}$, decision block 16 next compares the assigned number of attacks per vector, $A_{VEC}$, with the length of the current vector, $L_{VEC}$.

If the assigned number of attacks per vector, $A_{VEC}$, is greater than or equal to the length of the vector, $L_{VEC}$, then the logic flow proceeds to block 18 and $A_{AMT}$ is calculated. In an implemented embodiment wherein much of this process is performed in electronic hardware, the quantity $A_{VEC}*A_{UNITS}*W_{LESS}$ is calculated by software and supplied to the hardware as a single number. Division by $L_{VECL}$ is made easier because it is approximated as a power of two, thereby allowing the equivalent of division to be accomplished merely by shifting. The result of that operation is multiplied by $A_{UNITS}$ and $W_{LESS}$. $W_{LESS}$, the weight reduction factor, is a constant that provides a means by which the value of $A_{AMT}$ can be reduced when $A_{VEC}$ is less than $L_{VEC}$.

Decision block 31 compares $A_{AMT}$ with $A_{UNITS}$, and if $A_{AMT}$ is not greater than or equal to $A_{UNITS}$, $A_{AMT}$ is set to be equal to $A_{UNITS}$ by block 32. Block 33 then sets each prospective unit of intensity in the vector $U_{Y(0+OFFSET)}$ to $U[<_{Y(N-1)}]$ to $A_{AMT}$, truncating as necessary. The purpose of blocks 31 and 32 is to "smooth" the transition from the weighted-to-be-smaller region, where there are more desired attacks than there are pixels in the length of the vector, to the unweighted region, where there are fewer desired attacks than there are pixels in the length of the vector. Especially if $W_{LESS}$ is given a small value and $A_{AMT}$ is therefore able to become much smaller than $A_{UNITS}$ for the longest vectors that are shorter than $A_{VEC}$, the display will start to exhibit noticeble artifacts associated with this difference. Blocks 31 and 32 prevent $A_{AMT}$ from becoming smaller than $A_{UNITS}$, and thereby prevent this effect, by smoothing the transition between the two regions (which are logically separated by decision block 16).

Returning to block 16, if the assigned number of attacks per vector is not greater than or equal to the length of the current vector, decision block 17 checks to see if randomization is set to "on". If it is not, the OFFSET is set 21 to zero. If randomization is set to "on", then block 19 makes the OFFSET a random number from zero to any value that is less than the ratio of the length of the current vector, $L_{VEC}$, divided by the assigned number of attacks per vector, $A_{VEC}$ (again, simplified because AVEC is constrained to being a power of two). These randomizations include fractional parts, and are not just integers.

The next action is determined by block 20, which directs that the units of location along the length of the vector, from OFFSET to OFFSET+x(Lvec/Avec) for each x that produces a value less than $Y_{(N-1)}$. The units of prospective intensity, U, are truncated as necessary during this step. In the preferred implementation, all of the instances of Y are calculated and maintained as non-integers. Rounding is deferred until block 26 where the Y values are final.

Returning to decision block 12, if the current vector length is not greater than or equal to the minimum vector length, this block produces a "no". Block 30 then determines an OFFSET value from 0 to less than $L_{VEC}$. Then, depending on design and/or operation choices, any one of the following options can be adopted: do nothing (omit this point and vector completely) 13; put the maximum of either the units of intensity per attack, $A_{UNITS}$, or the attack units assigned per vector times the units of intensity per attack divided by the length of the vector approximated as a power of two (and never allowed to be less than one), $(A_{VEC}*A_{UNITS}*W_{LESS})/(L_{VECL})$, as the units of prospective additional intensity in the y-axis location of the current actual data point plus the OFFSET 30, $U_{(YO+OFFSET)}$, 14 (and nothing in any of the other pixels of that vector; $U_{YO} \rightarrow U_{Y(N-1)}$ except $U_{(YO+OFFSET)}$=0); or, put all of the assigned number of attacks per vector, $A_{VEC}$, times the units of intensity per attack, $A_{UNITS}$, times the weight reduction factor, $W_{LESS}$, in the initial data point, $U_{YO}$, 15 (and nothing in any of the other pixels of that vector; $U_{Y(O} \rightarrow U_{Y(N-1)}$, except $_{UYO+OFFSET}$)=0). These three choices can be roughly summarized, respectively, as "short vector elimination", "short vector truncation", and "short vector concentration". Short vector elimination is thought to have limited utility, while short vector truncation and short vector concentration both produce suitable displays under most conditions. They all, however, have the effect of reducing the time spent on rasterizing every point in the shortest vectors. Because an oscilloscope is usually continuously rasterizing a large number of waveforms, these areas containing the shortest vectors will quickly be affected by plenty of intensity attacks, even though spending a lot of time there can be avoided by the use of suitable values for $L_{MIN}$. Typically, these values will be in the range of one to three pixels. A value of zero turns the feature off completely.

Block 26 rounds the current value of all Y's to a particular pixel location. How this rounding is performed is somewhat arbitrary and may be influenced by design choices made elsewhere. However, in the preferred embodiment described herein, all rounding is toward the origin of the vector within which it is being performed. Every continuous vertical variable is rounded to the integer closest to its vector's origin point, Yo. This requires knowing the current direction of the vector. That information is available as the sign of the result of the subtraction performed in block 11., although is was not needed there to determine the magnitude of the vector.

Following the outcomes dictated by blocks 12–21, 26 and 30–33, decision block 24 compares the units of prospective additional intensity at each attacked location, $U_{YA}$, to a maximum value of attack intensity allowed, $A_{MAX.VAL}$, and if it is greater than that maximum value, it is reduced 25 to the maximum value, $U_{YA}=A_{MAX.VAL}$.

Block 27 then does a read-modify operation that retrieves the old intensity value, $I_{OLD}$, adds the prospective additional intensity units of the attacked pixel, $U_{YA}$, and thereby produces the new intensity value, $I_{NEW}$. Decision block 28 compares the new intensity value with a minimum attack intensity value, $I_{MIN.ATK}$, and if it is less, block 29 increases the new intensity value to be the minimum attack intensity. If the new intensity value is already above the minimum, it is used as the output of this process. The modified values for each pixel are then returned to their memory location as $I_{NEW}$, and this process is repeated for each of the affected pixels in this vector. Although not explicitly shown here, the $I_{NEW}$ value may require clipping to accomodate the length of the data space available at each pixel location in the raster display memory.

In an optional alternative embodiment, a check is made at decision block 22 to see if "DOT=ON". If so, one unit of intensity per attack, $A_{UNITS}$, (or some other value), is added 23 to the initial dot location, $Y_O$. This provides a means for ensuring that actual data locations are illuminated, as in dot mode, no matter what other options have been programmed to run in sparse vector mode. It should also be noted, however, that a dot mode effect can also be achieved by decision block 12 and the operations of blocks 12, 30, and 14 or 15, if a very long length such as 512 is set for $L_{MIN}$, the minimum length of vector to be fully attacked. Setting $A_{VEC}=1$ and RANDOM=OFF is a preferred way to achieve a dot mode equivalent.

The ability to change the assigned number of attacks per vector, $A_{VEC}$, allows control of rasterization times, and thereby permits the rasterizer to process vectors at a variable speed. This speed can be controlled as a function of the trigger rate, thereby maximumizing the waveform throughput by varying the quality of individual rasterizations to accommodate that variation. Numerous waveforms rasterized with some degree of randomness will fill in any "holes" that occur in individual waveforms. $A_{UNITS}$ can be provided as an operator control, through the use of a knob, a menu selection, or other human interface device. It permits the operator to control the overall "brightness" (intensity) of the display within the context of the variations in throughput created by $A_{VEC}$. The relative contributions of each form of control can be varied as a design choice or in accordance with other instrument settings or aspects of the display environment.

In the embodiment of this rasterizer described above, the input variables $A_{AMT}$, $A_{MAX.VAL}$, $A_{VEC}$, $A_{UNITS}$, $I_{MIN.ATK}$, $L_{MIN}$, and $W_{LESS}$ were described and discussed primarily from the point of view of how they could achieve new and desirable display control capabilities. It should be noted, however, that the given ways and means of controlling these inputs were not exhaustive and additional ways may be found to use the resources provided by this invention. Additional modes of operation and interaction with other controls might produce a variety of different results. For example, there may be a variety of ways to achieve variable persistence effects using the described input parameters, the general methods of this invention, and the considerable prior art on variable persistence control, some of which was incorporated by reference above.

It should also be noted that information feedback from the display, such as how many pixels are being operated at or near saturation intensity, or how many are active but below the level that is perceptible by the user, can be used to help determine the best settings for the input parameters. Similarly, measuring the time needed to perform the most recent rasterization, or the average or total time needed to perform some number of the most recent rasterizations, can provide another type of operational variable useful in controlling the input parameters to optimize performance with respect to one or another consideration.

Returning now to FIGS. 1A and 3A, let us follow FIG. 4 to see how the values in FIG. 3A are determined. In column 1, block 11 determines that $L_{VEC}=1$. With $L_{MIN}=0$, decision block 12 produces a "yes", sending us to decision block 16. With $A_{VEC}=2$ and $L_{VEC}=1$, block 16 also produces a "yes", sending us on to block 18. The ratio of $A_{VEC}=2$ over $L_{VECL}=1$ is 2, which is then multiplied by $A_{UNITS}=3$ and W=1 to produce $A_{AMT}=6$. Column two follows the same path to the same result.

In column 3, the vector length is 3, so decision block 12 again produces a "yes". Decision block 16 produces a "no", since $A_{VEC}=2$ is not greater than or equal to $L_{VEC}=3$. Assuming "random=on", the OFFSET will be found by block 19 to be in the range from 0 to <1.5. For this example, we will assume a randomly determined OFFSET of 0.75. Block 20 then determines that $A_{UNITS}=3$ of intensity will be placed at (pre-rounding) locations of 3+0.75=3.75, and 3+0.75+1.5=5.25. These are then rounded toward the origin of the vector so that pixels 3 and 5 of column 3 receive 3 units of intensity.

In column 4, the vector originating all pixel 6 has a length of 4, and the result from decision block 12 is again a "yes". Again, decision block 16 produces a "no", since $A_{VEC}=2$ is not greater than or equal to $L_{VEC}=4$. Assuming "random= on" produces a "yes" from block 17, block 19 will produce an OFFSET in the from 0 to <2. We will assume that the random process produced an OFFSET of 1.5. Block 20 then supplies $A_{UNITS}=3$ to locations 6+1.5=7.5, and 7.5+2=9.5. Rounding these down toward the origin of the vector provide pixels 7 and 9 each with 3 units of intensity.

Following a similar process in column 5 with the vector of length 4 originating at pixel 10, but assuming a randomly determined OFFSET of 0.5, the results that we get from block 20 are: 10.5 and 12.5. Three units of intensity is then placed in pixels 10 and 12 of column 5. The rest of the pixel attacks seen in FIGS. 3A and 3B are produced by similar processes following the logic of FIG. 4.

The concepts implemented in FIG. 4 for a single-column rasterizer are also generalizable to a sparce vector rasterization across multiple columns. To accomplish this, several steps in the process shown above require expansion. Block 11 is modified to find the approximate vector length. A simple and easy to implement approximation is to add the absolute value of the delta-X and delta-Y components, so that $L_{VEC}=|Yn-Yo|+|Xn-Xo|$. (There are more accurate ways to approximate the length of the vector, but this one is easy to compute and will readily demonstrate the concept.) The other major expansion of the process is to calculate an X coordinate as well as a Y coordinate every place where Y coordinates are calculated above.

Referring now to FIG. 3C, we see an example of the distribution of sparce vector points in two dimensions. Referring also to FIG. 1C to see the locations of the data inputs, we see that the distance in FIG. 3C between the input data points in columns 1 and 2 is 1 unit in the Y direction and 2 units in the X direction. From this we compute the approximate length of the vector to be 3 units. This will result in a "yes" from decision block 12 and a "no" from decision block 16. Assuming "RANDOM=ON" from decision block 17, block 19 will produce two OFFSET values, one in the X direction and one in the Y direction.

Block 19 is modified to accommodate both the X and Y directions by computing $LY_{VEC}$, the length of the vector in the Y direction, and $LX_{VEC}$, the length of the vector in the X direction. Then a random value, R, is computed which is between 0 and 1. The initial Y offset is then computed as the product of R and $LY_{VEC}/A_{VEC}$. The initial X offset is similarly computed as the product of R and $LX_{VEC}/A_{VEC}$. If the random value happens to be 0.75 then the initial Y offset is $R*LY_{VEC}/A_{VEC} =0.75*-1/2=-0.325$. The initial X offset is $R*LX_{VEC}/A_{VEC}=0.75*2/2=0.75$. Block 20 will produce two points as outputs. The first point will be (x,y)=(0.75, −0.325) relative to the origin of the vector. The second point is computed by adding $LX_{VEC}/A_{VEC}$ to the initial X coordinate and by adding $LY_{VEC}/A_{VEC}$ to the initial Y coordinate. Thus, the second point is (x,y)=(1.75, −0.825) relative to the origin of the vector. Finally, these coordinates are rounded to pixel locations. For this example we will truncate the X pixel address and round the Y address to the nearest integer. (This is equivalent to adding ½ to all X addresses and then rounding both X and Y addresses to the nearest integer.) This process produces attacks of 3 units on pixel 3 of column 1 and pixel 2 of column 2.

The next vector will produce a 3 unit attack on pixel 2 of column 3 without regard to what value of the random OFFSET is assumed. Whether the placement of the second 3 units of intensity is in pixel 2 or pixel 3 of column 4 depends on whether the OFFSET value produced is in the bottom half or the top half of the allowable offset values. For the vector originating at pixel 3 of column 5, the length in the Y axis, $LY_{VEC}$, is 3 and the length in the X axis, $LX_{VEC}$, is 2. The approximate vector length, $L_{VEC}$, is computed as 5 and block 16 produces a "no". Assuming "RANDOM=ON", block 17 produces a "yes". Block 19 produces a random value between 0 and 1. If we assume this value to be 0.2 then we can compute initial X and Y offset values. The initial Y offset is $R*LY_{VEC}/A_{VEC}=0.2*4/2=0.4$. The initial X offset is $R*LX_{VEC}/A_{VEC}=0.2*2/2=0.2$. Block 20 will produce two points as outputs which are (0.2, 0.4) and (1.2, 2.4) relative to the start of the vector. By truncating the X values and rounding the Y values to the nearest integer this process produces attacks of 3 units on pixel 3 of column 5 and pixel 5 of column 6.

Rasterization across multiple columns can also be accomplished by a series of operations performed by a single column rasterizer. An external interpolator can find the point where the vector between successive data points crosses intervening columns, identify the pixel in that column by rounding or truncating to a whole number, and then supplying that to the single column rasterizer as the next column's data point.

Figure 5:
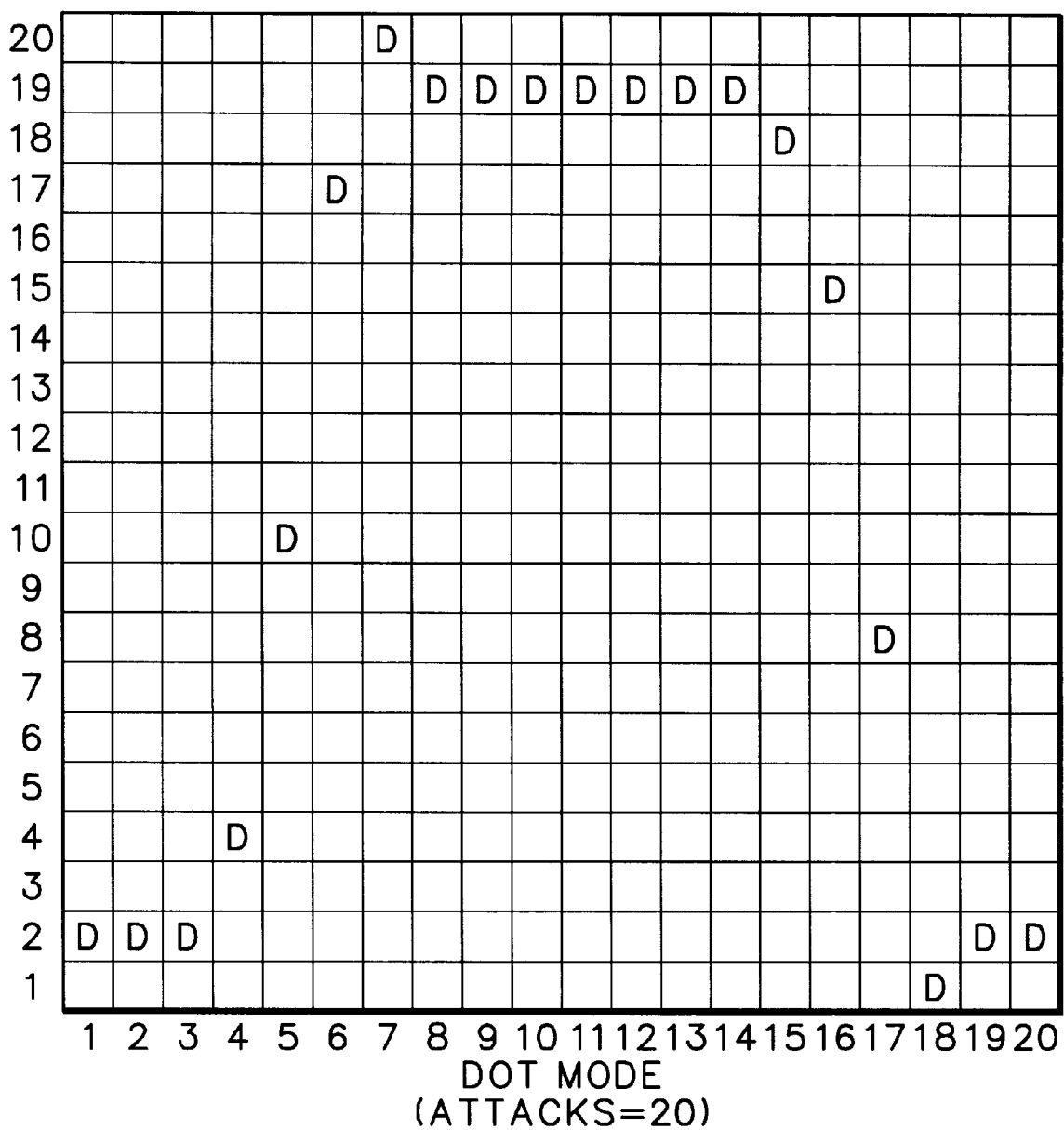
FIG. 5 is an illustration of a (prior art) single-value dot mode rasterization of a pulse signal having rising and falling edges.
Figure 6:
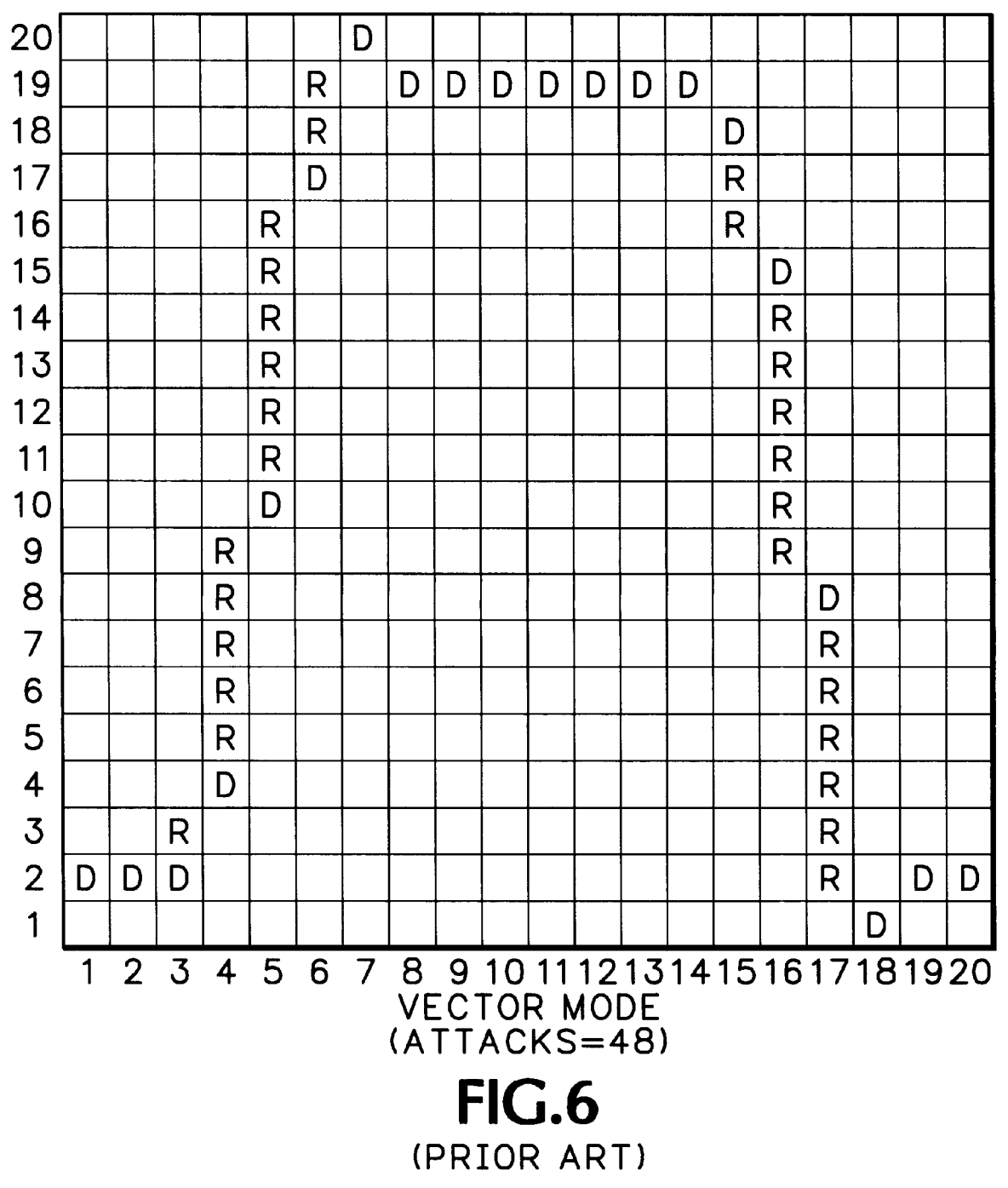
Figure 7:
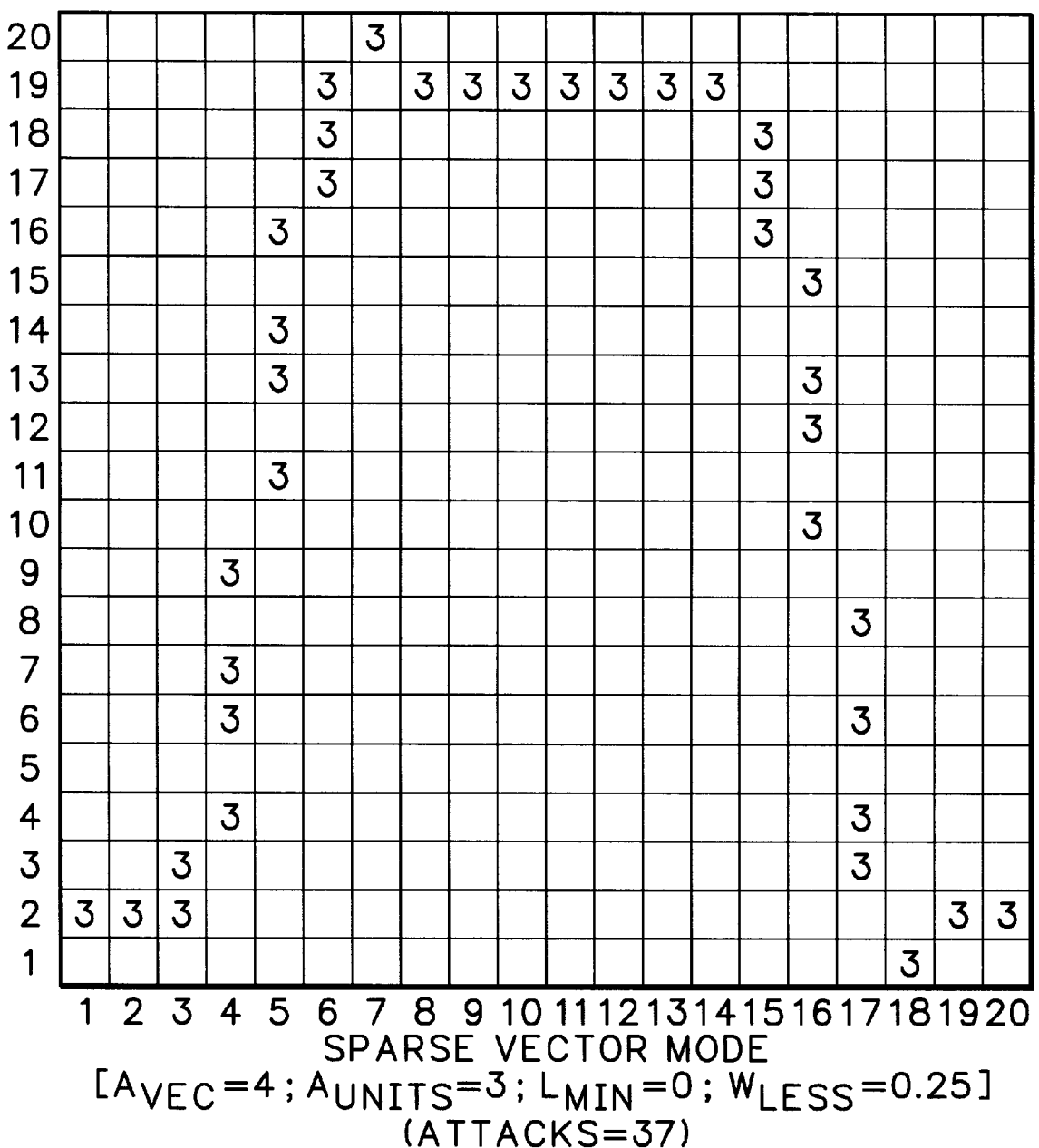
FIG. 7 is an illustration of a multi-value sparse vector mode rasterization according to the present invention of the same pulse signal shown in FIGS. 5 & 6, with the following settings for the control parameters of the rasterizer inputs: with $A_{VEC}=4$, $A_{UNITS}=3$, $L_{MIN}=0$, and $W_{LESS}=0.25$.
Figure 8:
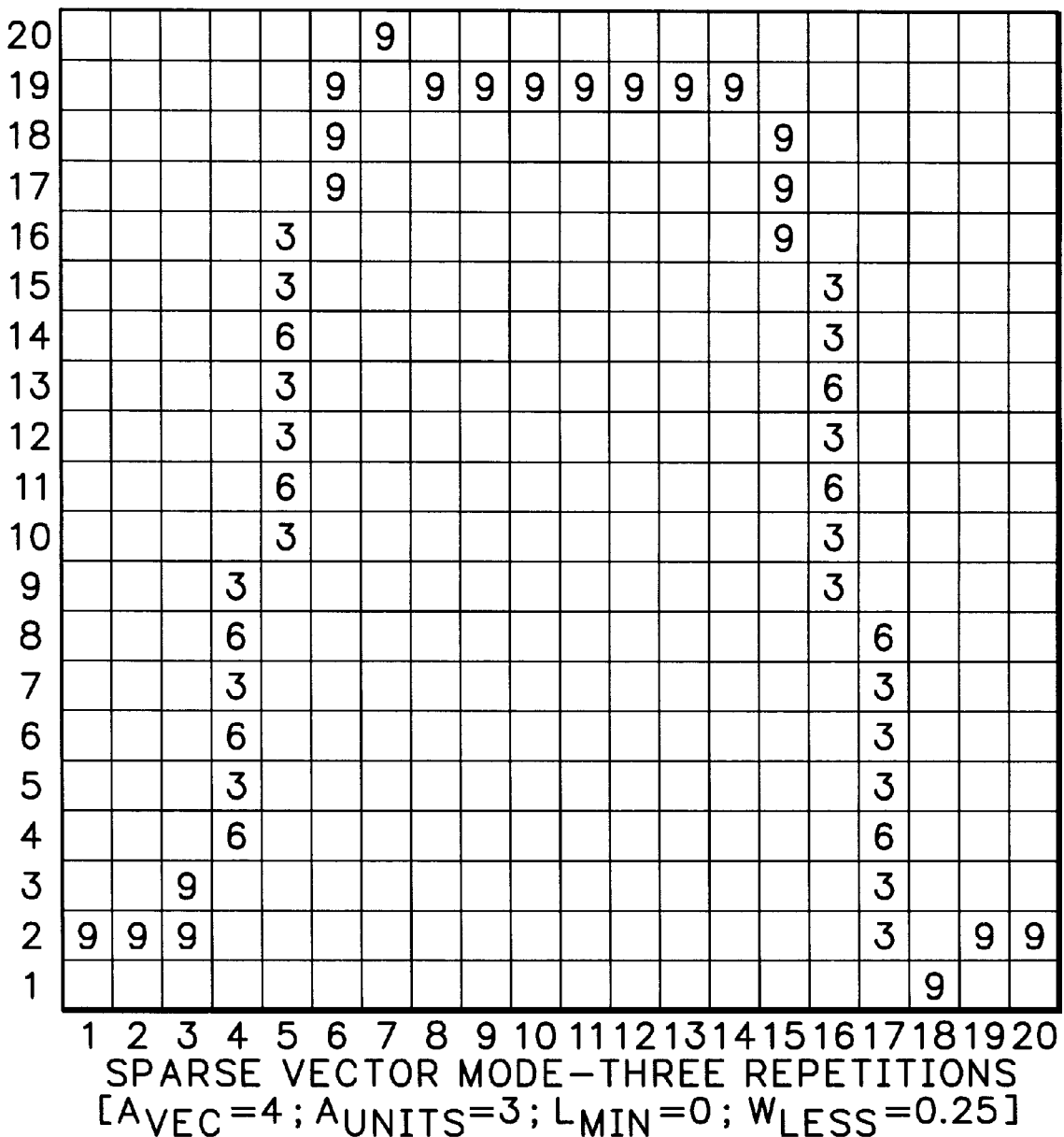
FIG. 8 is an illustration of three sparse vector rasterizations of the type illustrated in FIG. 7 composited into a cummulative raster scan image. The random portions of the algorithm of FIG. 4 were assumed to be different in each case in order to illustrate how randomizing fills in the pixels that are not filled in by individual rasterizer outputs.

FIGS. 5 and 6 show a pulse signal with rising and falling edges rasterized in dot mode and vector mode, respectively, according to the prior art. The number of single-value active pixels is 20 in dot mode and 48 in vector mode. FIG. 7 shows the same input data rasterized in sparse vector mode with an assigned number of attacks per vector of three, the units of intensity per attack equal to three, and the minimum vector length set to zero. These values produced 37 pixel attacks, somewhat closer to the number of attacks performed in dot mode than the number performed in vector mode. Bearing in mind that the individual sparse vector mode output shown here is only one among many such outputs that will be composited together, thereby allowing the effects of randomness to fill in the areas that are blank here, the cummulative effect of this mode of rasterization will be to produce a slope responsive waveform with a relatively faint trace on the rising and falling edges, and a brighter one in the constant voltage areas at the top and bottom of the pulse waveform. FIG. 8, which will be discussed in further detail below, shows the composit result of just three sparse vector rasterizations.

To see how the sparse vector rastorizer process illustrated in FIG. 4 produces the output shown in FIG. 7, we will now briefly analyze the generation of this waveform. For this rasterization, we will assume that the assigned number of attacks per vector, $A_{VEC}$, is set to 4, the units of intensity per attack, $A_{UNITS}$, is set to 3, the minimum vector length is set to zero, $L_{MIN}=0$, and the weight lessening factor is one fourth, $W_{LESS}=0.25$.

To simplify this discussion, we can do several columns at once, rather than in the sequential order in which they would actually be done by the sparse vector rasterizer. Noting that the vector lengths, $L_{VEC}$, in columns 1–2, 7–14, and 18–20 are all zero or one, and since the vector length is constrained to have a minimum value of 1, we can conclude that the intensity value calculation for all of these columns is the same. Thus, for these columns, decision block 12 produces a "yes", as will decision block 16. Block 18 finds that $A_{AMT}=(A_{VEC}/L_{VECL})*A_{UNITS}*W_{LESS}=(4/1)*3*0.25=3$. Decision block 31 produces a "yes", since $A_{AMT}=3$ is equal to $A_{UNITS}=3$. Block 33, will set U=3 as the prospective intensity value of pixels 2 in columns 1–2 and 19–20, pixels 19 in columns 8–14, pixel 20 of column 7, and pixel 1 of column 18. (We assume for this example that blocks 22 and 23 are not being used, or that "DOT=OFF"; so no extra intensity units per attack was supplied by block 23.) Looking now to column 3, the vector length of 2. Since 2 is greater than or equal to 0, decision block 12 produces a "yes", and the decision making is passed to block 16. As $A_{VEC}=4>=L_{VEC}=2$, decision block 16 also produces a "yes". Block 18 then determines that $A_{AMT}=1.5$. Since 1.5 is not greater than or equal to 3, decision block 31 produces a "no". Block 32 then changes $A_{AMT}$ to 3, the value of $A_{UNITS}$. Block 33 then sets all of the $U_Y$ from $Y_O$ to $Y_{(N-1)}$ to receive $A_{AMT}=3$ as their value.

Going next to column 4, the vector length is 6. Passing through decision block 12, $A_{VEC}=4$ is now less than $L_{VEC}=6$, so decision block 16 produces a "no". With "random=on", we go to block 19 and it produces a random OFFSET value from 0 to <(6/4), i.e., less than 1.5. Assuming for this example that the random OFFSET value is determined to be 0.5, block 20 then sets the $U_Y$ locations every $L_{VEC}/A_{VEC}$= 1.5 distance apart from $Y_{(0+OFFSET)}$ to $<Y_{(N-1)}$ equal to $A_{UNITS}$=3. These are: 4+0.5=4.5, 4.5+1.5=6, 6+1.5=7.5, and 7.5+1.5=9. When these y-axis locations are rounded dow by block 26 toward this vector's origin, they become: 4, 6, 7 and 9.

In column 5, the vector length is 7. Decision block 12 again produces a "yes". Since $A_{VEC}$=4 is less than $L_{VEC}$=7, decision block 16 produces a "no". Again assuming "random=on", decision block 17 produces a "yes", the process to block 19, which then produces an OFFSET in the range of 0 to <1.75. For this example we set the OFFSET to 1.25. Block 20 then sets the $U_Y$ locations locations every $L_{VEC}/A_{VEC}$=1.75 distance apart from $Y_{(0+OFFSET)}$ to $<Y_{(N-1)}$ equal to $A_{UNITS}$=3. These are: 10+1.25=11.25, 11.25+1.75= 13, 13+1.75=14.75, and 14.75+1.75=16.5. When these y-axis locations are rounded down by block 26 toward this vector's origin, they become: 11, 13, 14 and 16.

The vector originating at pixel 17 of column 6 has a length of 3. Since $A_{VEC}$=4 is greater than $L_{VEC}$=3, decision block 16 produces a "yes". Block 18 then determines that $A_{AMT=}$ $(A_{VEC}/L_{VECL})*A_{UNITS}*W_{LESS}$=(4/4)*3*0.25=0.75. Since this is less than the $A_{UNITS}$ value of 3, decision block 31 produces a "no" and block 32 increases $A_{AMT}$ to equal $A_{UNITS}$, i.e., 3. Block 33 gives that $A_{AMT}$ value of 3 to all of the $U_Y$ locations within the range from 17 to less than 20, or 17, 18, and 19.

Skipping past columns 7–14, the values for which were determined above, we next look at the vector originating in pixel 18 of column 15. Its length is 3, so $L_{VEC}$=3 and decision block 12 produces a "yes". Since $A_{VEC}$=4 is greater than $L_{VEC}$=3, decision block 16 produces a "yes". Block 18 finds that $A_{AMT=(AVEC}/L_{VECL})*A_{UNITS}*W_{LESS}$=(4/2) *3*0.25=1.5. Since this is less than the AMTS value of 3, decision block 31 produces a "no" and block 32 increases $A_{AMT}$ to equal $A_{UNITS}$, i.e., 3. Block 33 gives the $A_{AMT}$ value of 3 to all of the $U_Y$ locations within the range from 18 to greater than 15, or 18, 17, 16. Because this vector moves from top to bottom and thus has a negative sign, the "less than" of block 33 effectively becomes a "greater than".

The vector originating at pixel 15 of column 16 is 7 pixels in length, and so decision block 12 produces a "yes". Decision block 16 produces a "no", since $A_{VEC}$=4 is not greater than $L_{VEC}$=7. With "random=on", decision block 17 produces a "yes" and block 19 randomly determines an OFFSET value from zero to greater than −1.75. If we assume an OFFSET of −0.25, block 20 will produce y-axis location outputs of 15−0.25=14.75, 14.75−1.75=13, 13−1.75=11.25, and 11.25−1.75=9.5. Block 26 then rounds these values toward the origin of the vector that they are in and the 3 intensity units will go into pixels 15, 13, 12, and 10 of column 16.

Going next to column 17, the vector length is 7. Passing through decision block 12, $A_{VEC}$=4 is now less than $L_{VEC}$=7, so decision block 16 produces a "no". With "random=on", we go to block 19 and it produces a random OFFSET value from 0 to >(−7/4), i.e., greater than −1.75. Assuming for this example that the random OFFSET value is determined to be −0.5, block 20 then sets the $U_Y$ locations every $L_{VEC}/A_{VEC}$= 1.75 distance apart from $Y_{(0+OFFSET)}$ to $<Y_{(N-1)}$ equal to $A_{UNITS}$=3. These are: 8−0.5=7.5, 7.5−1.75=5.75, 5.75− 1.75=4, and 4−1.75=2.25. When these y-axis locations are rounded by block 26 toward this vector's origin, they become: 8, 6, 4 and 3.

It may be observed in FIG. 7 that the vectors produced were not very "sparse" and that the total attacks, 37, were not very many fewer than the 48 needed in vector mode (FIG. 6). Also, the rising and falling edges of this pulse, except for the "holes" in the waveform, received the same amount of intensity as baseline and top of this pulse. In part this was because the $W_{LESS}$ weight reduction factor setting of 0.25 strongly reduced the intensity of the baseline and top of the waveform, since that is where all the short vectors were. Another reason for this lack of intensity contrast is the relationship between the size of $A_{VEC}$ at 4 and the longest vectors of this little pulse, 6 and 7. These vectors were relatively short both because of the small 20×20 size of this illustration and the fact that these edges were not rising and falling very steeply. If the reader were to imagine a more realistic screen size of 500×400 pixels, and a pulse of that size with sharply rising and falling edges, it should quickly become apparent that the vectors in that case would be very dimmed by an $A_{VEC}$ setting of only 4, i.e., there would be much larger "holes" in the vector.

The reader is also asked to recognize that, over sufficient trials, "random=on" will produce all possible outcomes, and the sparse-looking outputs shown will be suitably filled in those areas that are left open by this illustration of a single instance. FIG. 8, shows the composite result of three sparse vector rasterizations of the type illustrated in FIG. 7, with the "random" results chosen (non-randomly) to be different in each case for the purpose of illustration. Note how the intensity is fairly evenly reduced on the rising and falling edges.

It has also been found that the use of sparse vectoring can be made even more effective if fewer pixels are attacked in short vectors. Setting the minimum vector length, $L_{MIN}$, to some small integer value, and then using it to qualify the use of normal sparse vectoring, has produced very satisfactory displays in less time where noise or other sources of numerous short vectors would otherwise waste a lot of time. This constraint does not affect the larger and more interesting signal features. The following discussion of FIGS. 9, 10 and 11 will help to illustrate this feature.

Figure 9:
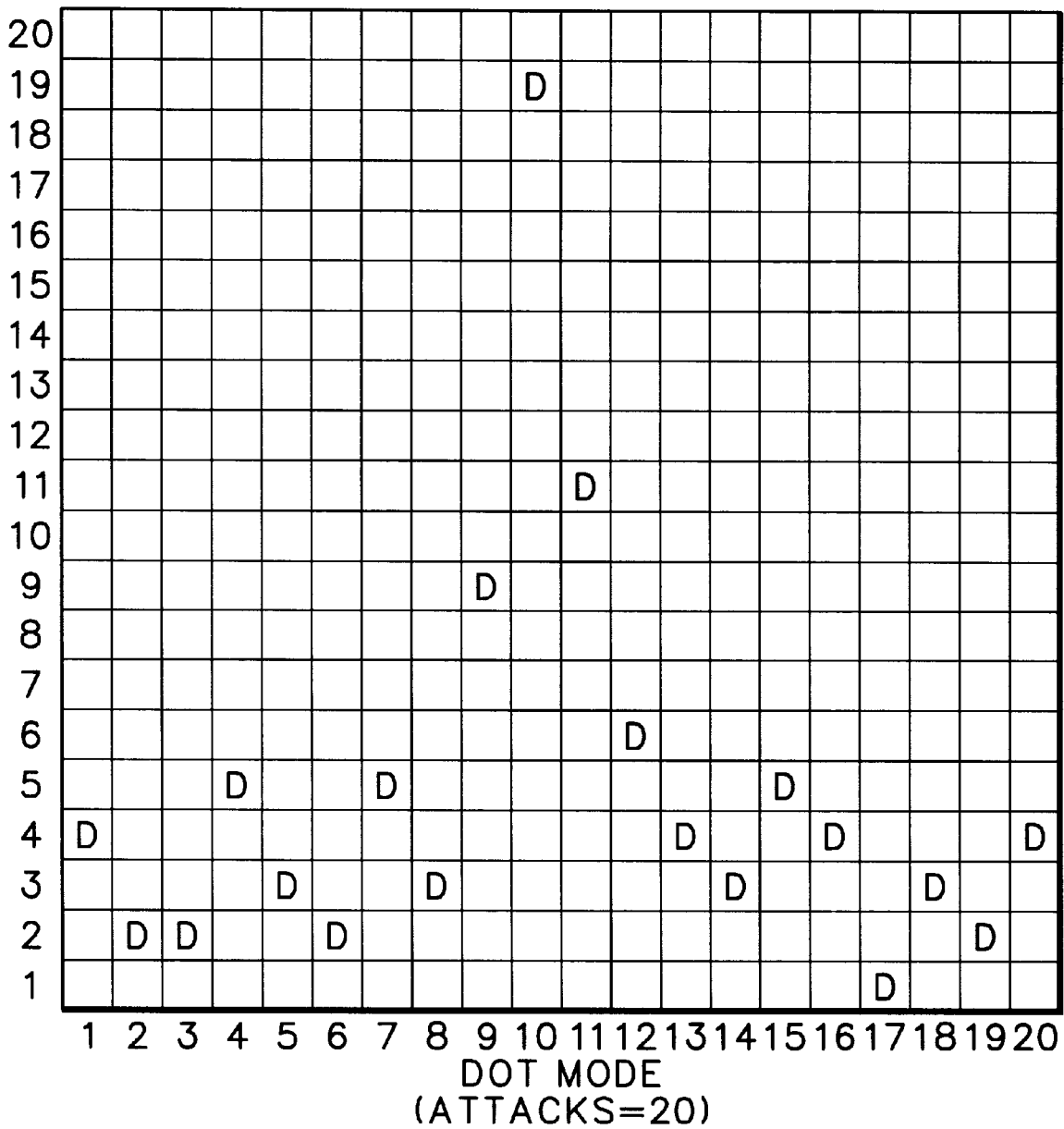
FIG. 9 is an illustration of a (prior art) single-value dot mode rasterization of a noise spike riding a small and noisy waveform.
Figure 10:
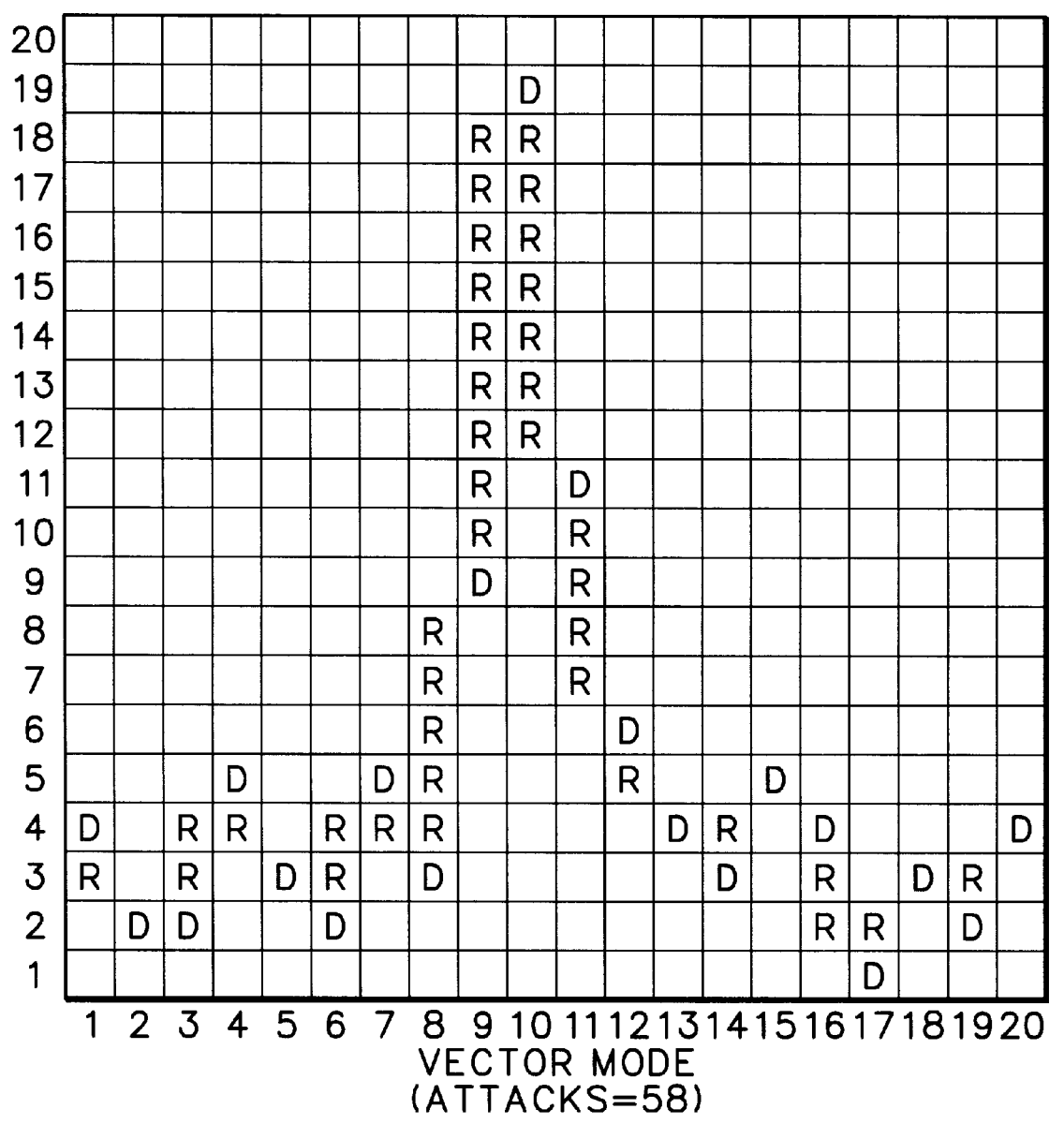

Referring to FIG. 9, this is an illustration of a prior art single-value dot mode rasterization of a large noise spike or small signal emerging from a background of noise. In this dot mode example, the number of acquired waveform input points (20) is equal to the number of horizontal pixel columns (20) in the raster output. FIG. 10 shows the output when this same input waveform data is processed in vector mode. The number of active output pixels has increased from 20 to 58.

Figure 11:
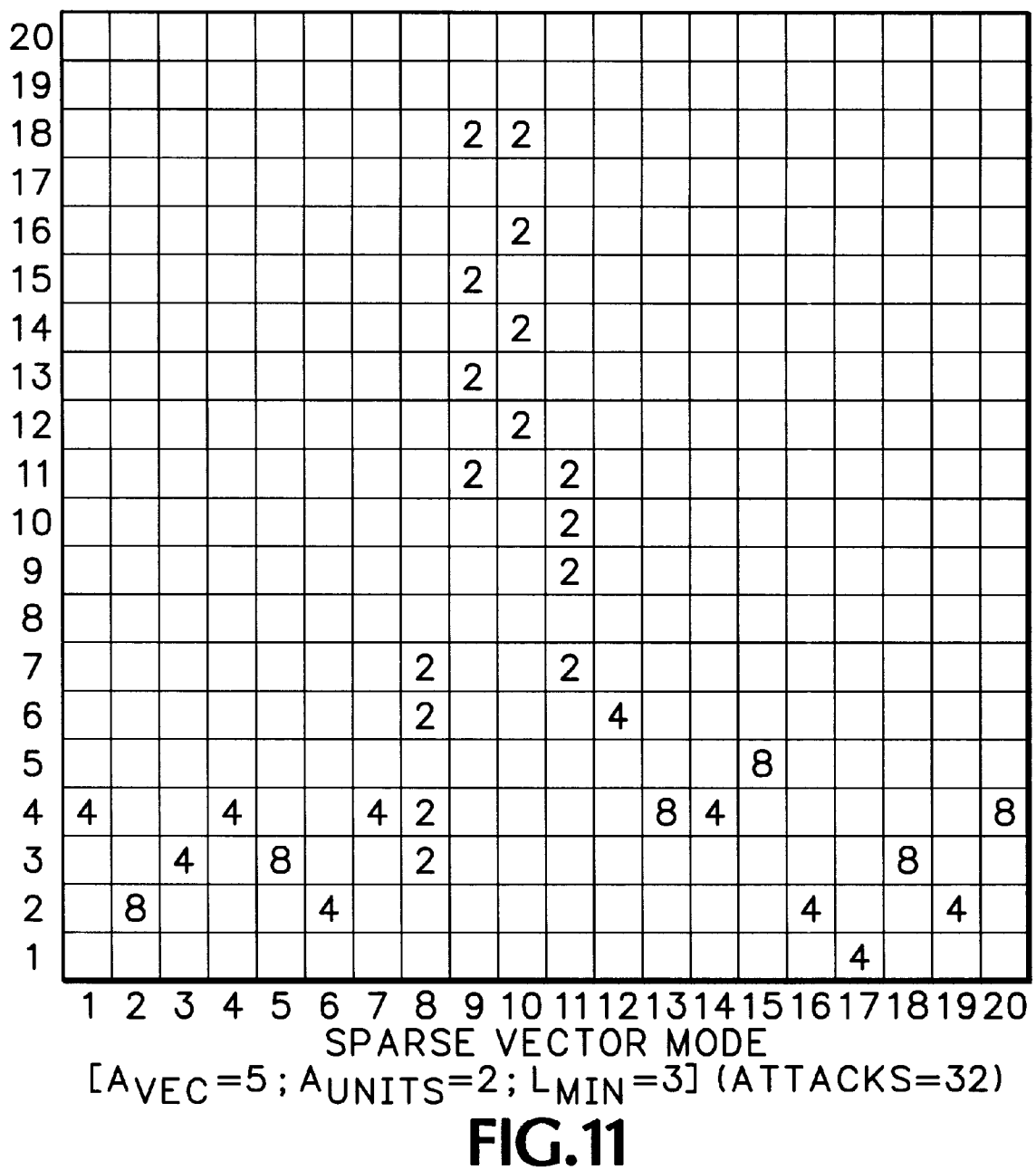
FIG. 11 is an illustration of a multi-value sparse vector mode rasterization according to the present invention, with $A_{VEC}=5$, $A_{UNITS}=2$, and $L_{MIN}=3$, of the same signal as shown rasterized in FIGS. 9 and 10,.

In FIG. 11 we see a sparse vector mode rasterization of the same waveform that was the basis for the outputs shown in FIGS. 9 and 10. In this rasterization the minimum vector length is set to 3 ($L_{MIN}$=3), the assigned number of attacks per vector is 4 ($A_{VEC}$=4), the units of intensity per attack is 2 ($A_{UNITS}$=2), and $W_{LESS}$ is set to zero. It can be seen that except near the voltage spike in the middle of this waveform, all of the vectors have a length of 3 or less.

Referring now to blocks 30, 14 and 15 of FIG. 4, as well as FIG. 11, note that with a $L_{MIN}$=4, for all values of $L_{VEC}$<4, decision block 12 will produce a "no". Block 30 will then produce an OFFSET value from 0 to less than $L_{VEC}$. Thus, the intensity values that are calculated by block 14 or 15 will all be placed on a randomly chosen pixel along these vectors. Vector lengths of 2 and 3, because they are represented in block 14 approximated by their common logarithm and will both therefore appear to be a 2, will produce an output value that is the maximum of the value of $A_{UNITS}$, which in this instance is 2, or $(A_{VEC}*A_{UNITS}*W_{LESS})/L_{VECL}=(4\times2\times1)/(2)=8/2=4$. Thus, the output of block 14 is 4 for vectors of length 2 or 3. Vectors of lengths of 0 and 1 cause block 14 to produce a value of $(4\times2\times1)/(1)=8$, since it is also larger than the other alternative, 2. $L_{VECL}$ is constrained to having a minimum value of 1 in order to allow it to be a divisor, just as $L_{VEC}$ is.

Continuing to use FIGS. 4, 9, and 11, we progress to the longer vectors in FIG. 11. In column 8, the vector length is 6. A vector length of 6 produces a "yes" outcome from decision block 12, since the minimum vector length was 4. An $L_{VEC}$ of 6 produces a "no" outcome from decision block 16, since $A_{VEC}$ is 4. With "random=on", decision block 17 will provide a "yes" and block 19 will produce an OFFSET range from 0 to less than 1.5. For this part of this example we will assume that the offset output was 0. Block 20 then causes intensity values of 2 ($A_{UNITS}=2$) to be put in every 1.5th pixel starting at the offset of 0. Thus, the y-axis outputs of block 20 will be: 3+0=3, 3+1.5=4.5, 4.5+1.5=6, and 6+1.5=7.5. As these values are rounded down, toward the origin of this vector, by block 26, the following pixels in column 8 will receive 2 intensity units each: 3, 4, 6 and 7.

Continuing with column 9, the vector length is 10. A vector length of 10 produces a "yes" outcome from decision block 12, since the minimum vector length was 4. An $L_{VEC}$ of 10 produces a "no" outcome from decision block 16, since $A_{VEC}$ is 4. With "random=on", decision block 17 will provide a "yes" and block 19 will produce an OFFSET range from 0 to less than 2.5. For this part of this example we will assume that the offset output was 2.25. Block 20 then causes intensity values of 2 ($A_{UNITS}=2$) to be put in every 2.5th pixel starting at the offset of 2.25. Thus, the y-axis outputs of block 20 will be: 9+2.25=11.25, 11.25+2.25=13.5, 13.5+2.25=15.75, and 15.75+2.25=18. As these values are rounded down, toward the origin of this vector, by block 26, the following pixels in column 9 will receive 2 intensity units each: 11, 13, 15 and 18.

Continuing with column 10, the vector length this time is 8. A vector length of 8 produces a "yes" outcome from decision block 12, since the minimum vector length was 4. An $L_{VEC}$ of 8 produces a "no" outcome from decision block 16, since $A_{VEC}$ is 4. With "random=on", decision block 17 will provide a "yes" and block 19 will produce an OFFSET range from 0 to greater than 2 (negative vector changes the sign of the OFFSET range). For this part of this example we will assume that the OFFSET output was 1.0. Block 20 then causes intensity values of 2 ($A_{UNITS}=2$) to be put in every 2nd pixel starting at the OFFSET of 1.0. Thus, the y-axis outputs of block 20 will be: 19−1=18, 18−2=16, 16−2=14, and 14−2=12. As these values are rounded up, toward the origin of this vector, by block 26, the following pixels in column 10 will receive 2 intensity units each: 18, 16, 14 and 12.

Finally, focusing on column 11, the vector length this time is 5. A vector length of 5 produces a "yes" outcome from decision block 12, since the minimum vector length was 4. An $L_{VEC}$ of 5 produces a "no" outcome from decision block 16, since $A_{VEC}$, is 4. With "random=on", decision block 17 will provide a "yes" and block 19 will produce an OFFSET range from 0 to greater than 1.25 (again, the negative vector changes the sign of the OFFSET range). For this part of this example we will assume that the OFFSET output was 0.25. Block 20 then causes intensity values of 2 ($A_{UNITS}=2$) to be put in every 1.25th pixel starting at the OFFSET of 0.25.

Thus, the y-axis outputs of block 20 will be: 11−0.25=10.75, 10.75−1.25=9.5, 9.5−1.25=8.25, and 8.25−1.25=7. As these values are rounded up, toward the origin of this vector, by block 26, the following pixels in column 11 will receive 2 intensity units each: 11, 10, 9 and 7.

The predominant effect of setting the minimum vector length to a relatively high value such as 4, is the large reduction in the number of attacks, in this case from the 46 that would have been produced with $L_{MIN}=0$ to the 32 produced using a minimum vector length of 4. Processing several repetitive waveforms and the inherent randomness of noise will fill in the area with the short vectors and the "holes" in the voltage spike of the longer vectors, producing after several waveform rasterizations a waveform that exhibits analog-like "slope responsive vectoring" (similar to that produced by the system described in U.S. Pat. No. 5,550,963 to Siegel et al. for "Graded Display of Digitally Compressed Waveforms").

The primary goals of this approach to rasterization are twofold. First, providing an effective way to keep the rasterizer running at an optimum speed based on the rate at which new waveforms are being acquired. $A_{VEC}$ accomplishes this goal by allowing the rasterizer to spend less time on each waveform as more waveforms become available. The other goal of this approach is to provide the operator with a "Brightness" (or "Intensity") control that feels and acts like the brightness or intensity control of an analog CRT. The setting of $A_{UNITS}$ makes all waveforms brighter or dimmer, in accordance with the operator's preference, and largely without regard to the trigger and waveform acquisition rate or the way $A_{VEC}$ responds to them.

While in the inventors' preferred implementation, inputs from the operator's use of the "Brightness" control primarily affect the value of $A_{UNITS}$, its interaction with other settings may also produce differences in the way $A_{VEC}$ and $A_{UNITS}$ are applied to the rasterizer. The values taken by these variables can be controlled by the settings of the instrument and the nature of the incoming waveform or waveforms. For example, changing the number of channels that are active in acquisition and display adds to the number of waveforms requiring rasterization, and this affects the brightness of each waveform, assuming that a single rasterizer is shared and that it has a fixed maximum drawing speed. Thus, the value assigned to $A_{VEC}$ must be reduced to allow the increased rasterizer input, and $A_{UNITS}$ then has to be increased to produce a relatively constant brightness. The operator's choice of a resolution setting is also taken into account, since there is a tradeoff between resolution and update rate. The instrument's actual trigger rate typically controls $A_{VEC}$, but as noted above its value may have to be adjusted to compensate for other settings of the instrument. While the goals outlined above reflected with inventors' preferences within a design environment, the invention as broadly understood will not necessarily be limited to such goals and other ways of manipulating the controls of a sparse vector mode rasterizer are still within the scope of the invention.

The value of $L_{MIN}$ used in decision block 12 will usually be fixed at a small value, such as 2 or 3. At this setting, drawing time can be significantly reduced without having a significant adverse impact on the display quality. However, if the trigger rate is low enough, $L_{MIN}$ can be set to 0 or 1. The randomizing feature will generally always be set to "on" to avoid display device aliasing. The option provided by "DOTS=ON" was included for flexibility but has thus far not been found to be of much use in improving waveform quality within the preferred implementation.

The $A_{MAX.VAL}$ control is used to help prevent saturation at high trigger rates where high wavefrom intensity is desired.

It helps limit the brightness of each rasterized waveform in order to reduce the tendancy of the waveform plane to saturate when plotting multiple waveforms. The $I_{MIN}$ control is used in conjunction with the highest brightness control settings chosen by the user. By bringing up the minimum intensity level, it serves to assure the user that every piece of data will be seen, even if this is at the expense of greyscale information over large portions of the display.

While a preferred embodiment of the present invention has been shown and described, it will be apparent to those skilled in the art that many changes and modifications may be made without departing from the invention in its broader aspects. For example, the dependent and independent variables could be other than the voltage-versus-time variables used for the above description. Similarly, vertical and horizontal axes could be reversed. And, certainly, many of the control interactions described could be implemented in various alternative ways and in the furtherence of different design goals. The claims that follow are therefore intended to cover all such changes and modifications as are permitted by the patents laws of the respective countries in which this patent is granted.

What is claimed is:

1. A method for rasterization of a set of first-variable versus second-variable data-address pairs into vectors of pixels in a multi-bit raster scan display of an electronic data acquisition instrument, the method comprising the steps of:
   (a) supplying a series of data-address pairs to be rasterized, the address portion of each data-address pair specifying a particular column of the multi-bit raster scan display and the data portion of each data-address pair specifying a particular pixel within that column;
   (b) selecting a number of attacks per vector, the number of attacks per vector being the approximate number of pixel modifications that will be performed during the rasterization of each vector;
   (c) choosing a number of intensity units per attack, each intensity unit representing a quantum of brightness to be displayed by a pixel of the multi-bit raster scan display;
   (d) finding a number of pixels in each current vector, by
      (1) determining a first end pixel location from the current data-address pair,
      (2) also determining a second end pixel location from the next data-address pair, and
      (3) using the first end pixel location and the second end pixel location to determine the length of the current vector in pixels; and
   (e) if the selected number of attacks per vector is equal to or greater than the number of pixels in the current vector, applying the chosen number of intensity units per attack, or a determined multiple thereof, to each pixel in the current vector; or
   (f) if the selected number of attacks per vector is less than the number of pixels in the current vector, distributing the chosen number of intensity units per attack to each of a number of pixels in the current vector that is approximately equal to or less than the selected number of attacks per vector.

2. A method of rasterization according to claim 1 wherein the determined multiple of the applying step (e) is found by a step comprising the step of dividing the selected number of attacks per vector by a number representative of the number of pixels in the current vector.

3. A method of rasterization according to claim 2 wherein the number representative of the number of pixels in the current vector is number of pixels in the current vector approximated by rounding down to a nearest number that is a power two.

4. A method of rasterization according to claim 1 wherein the distributing step (f) comprises some randomizing function.

5. A method of rasterization according to claim 1 wherein the distributing step (f) comprises the steps of:
   (1) calculating an initial offset value measured in pixels;
   (2) computing a periodic increment value measured in pixels; and
   (3) using the initial offset value and the periodic increment value to determine which pixels in the current vector are to receive intensity units.

6. A method of rasterization according to claim 5 wherein the calculating step (f)(1) includes the use of some randomizing function.

7. A method for rasterization according to claim 1 wherein the step of selecting the number of attacks per vector relies, at least in part, upon a trigger rate of the electronic data acquisition instrument.

8. A method for rasterization according to claim 1 wherein the step of choosing a number of intensity units per attack relies, at least in part, upon operator input.

9. A method for rasterization according to claim 1 wherein intensity units are only applied to a single pixel in the current vector if the number of pixels in the current vector is less than a preassigned minimum.

10. A method for rasterization according to claim 1 wherein step (e) further comprises the steps of:
    (1) comparing the total intensity units in the determined multiple of the chosen number of intensity units per attack to a predetermined maximum number; and
    (2) reducing the total intensity units to the predetermined maximum number if the comparison of step (1) indicates that the total intensity units exceeds the predetermined maximum number.

11. A method for rasterization according to claim 1 wherein the selected number of attacks per vector is constrained to always be a power of two.

12. A method for rasterization according to claim 1 wherein the first-variable is amplitude and the second-variable is frequency.

13. A method for rasterization according to claim 1 wherein the determined multiple of step (e) is affected by the value of a constant adjustable for reducing a total of intensity units supplied to each pixel in the current vector.

14. A method for rasterization according to claim 1 wherein the vectors of pixels of the multi-bit raster scan display are vertically aligned and all of the pixels within the vector lie within one column of the raster scan display.

15. A method for rasterization according to claim 1 wherein the vectors of pixels of the multi-bit raster scan display includes vectors having horizontal component and some of the pixels within the vector lie within different columns of the raster scan display than does the first end pixel location.

16. A method for rasterization according to claim 1, wherein the first-variable is voltage and the second-variable is time.

17. A method of rasterization according to claim 16 wherein the determined multiple of the applying step (e) is found by a step comprising the step of dividing the selected number of attacks per vector by a number representative of the number of pixels in the current vector.

18. A method of rasterization according to claim 17 wherein the number representative of the number of pixels in the current vector is number of pixels in the current vector approximated by rounding down to a nearest number that is a power two.

19. A method of rasterization according to claim 16 wherein the distributing step (f) comprises some randomizing function.

20. A method of rasterization according to claim 16 wherein the distributing step (f) comprises the steps of:

(1) calculating an initial offset value measured in pixels;

(2) computing a periodic increment value measured in pixels; and (3) using the initial offset value and the periodic increment value to determine which pixels in the current vector are to receive intensity units.

21. A method of rasterization according to claim 20 wherein the calculating step (f)(1) includes the use of some randomizing function.

22. A method for rasterization according to claim 16 wherein the step of selecting the number of attacks per vector relies, at least in part, upon a trigger rate of the electronic data acquisition instrument.

23. A method for rasterization according to claim 16 wherein the step of choosing a number of intensity units per attack relies, at least in part, upon operator input.

24. A method for rasterization according to claim 16 wherein intensity units are only applied to a single pixel in the current vector if the number of pixels in the current vector is less than a preassigned minimum.

25. A method for rasterization according to claim 16 wherein step (e) further comprises the steps of:

(1) comparing the total intensity units in the determined multiple of the chosen number of intensity units per attack to a predetermined maximum number; and (2) reducing the total intensity units to the predetermined maximum number if the comparison of step (1) indicates that the total intensity units exceeds the predetermined maximum number.

26. A method for rasterization according to claim 16 wherein the selected number of attacks per vector is constrained to always be a power of two.

27. A method for rasterization according to claim 16 wherein the determined multiple of step (e) is affected by the value of a constant adjustable for reducing a total of intensity units supplied to each pixel in the current vector.

28. A method for rasterization according to claim 16 wherein the vectors of pixels of the multi-bit raster scan display are vertically aligned and all of the pixels within the vector lie within one column of the raster scan display.

29. A method for rasterization according to claim 16 wherein the vectors of pixels of the multi-bit raster scan display includes vectors having horizontal component and some of the pixels within the vector lie within different columns of the raster scan display than does the first end pixel location.

* * * * *